United States Patent
Hidaka et al.

(10) Patent No.: US 6,603,685 B2
(45) Date of Patent: Aug. 5, 2003

(54) SEMICONDUCTOR INTEGRATED CIRCUIT DEVICE CAPABLE OF ENSURING RELIABILITY OF TRANSISTOR DRIVING HIGH VOLTAGE

(75) Inventors: Hideto Hidaka, Hyogo (JP); Hiroaki Tanizaki, Hyogo (JP); Tsukasa Ooishi, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/778,261

(22) Filed: Feb. 8, 2001

(65) Prior Publication Data

US 2001/0053099 A1 Dec. 20, 2001

(30) Foreign Application Priority Data

Jun. 7, 2000 (JP) ........................................ 2000-170455

(51) Int. Cl.[7] ................................................. G11C 7/00
(52) U.S. Cl. .................................. 365/189.11; 365/226
(58) Field of Search ............................. 365/189.11, 226, 365/189.05, 185.23

(56) References Cited

U.S. PATENT DOCUMENTS

| | | | |
|---|---|---|---|
| 5,293,561 A | * 3/1994 | Nizaka | 365/189.11 |
| 5,875,129 A | * 2/1999 | Atsumi et al. | 365/189.11 |
| 5,903,513 A | * 5/1999 | Itou | 365/189.11 |
| 5,982,695 A | * 11/1999 | Mukai | 365/189.11 |
| 6,038,189 A | * 3/2000 | Morishita | 365/189.11 |
| 6,157,582 A | * 12/2000 | Rezeanu | 365/189.11 |
| 6,229,753 B1 | * 5/2001 | Kono et al. | 365/189.11 |
| 6,228,952 B1 | * 9/2001 | Zheng | 365/189.11 |

FOREIGN PATENT DOCUMENTS

| | | |
|---|---|---|
| JP | 06-318699 | 11/1994 |
| JP | 09-007371 | 1/1997 |

* cited by examiner

*Primary Examiner*—Tan T. Nguyen
(74) *Attorney, Agent, or Firm*—McDermott, Will & Emery

(57) ABSTRACT

A driving circuit includes a voltage converting circuit receiving a block selection signal and converting to a signal of a boosted potential level, and first and second N channel MOS transistors connected in series between the boosted potential and the ground potential. The gate of the first transistor receives the boosted potential, and a potential level at a connection node between the first and second transistors is provided as a signal BLI (i, 0).

26 Claims, 26 Drawing Sheets

BSi IS A SELECTING SIGNAL
FOR ith MEMORY CELL BLOCK
TYPICAL POWER SUPPLY
VOLTAGE
Vcc=2.0V
Vpp=3.5V

SEMICONDUCTOR INTEGRATED CIRCUIT DEVICE CAPABLE OF ENSURING RELIABILITY OF TRANSISTOR DRIVING HIGH VOLTAGE

BACKGROUND OF THE INVENTION

1. Field of the Invention

The present invention relates to a configuration of a semiconductor integrated circuit device and, more particularly, to a circuit configuration operating at a voltage higher than in other circuit portions in a semiconductor integrated circuit device.

2. Description of the Background Art

In a semiconductor integrated circuit device, for example, in a dynamic random access memory (DRAM) as a semiconductor memory device, generally an internal power supply circuit is mounted, for supplying an internal boosted potential by boosting an externally applied power supply voltage.

More specifically, in a word line potential driving circuit of a DRAM, the above described internally boosted potential is used to make gate potential of an access transistor in a memory cell sufficiently high to prevent voltage drop in the access transistor.

When a sense amplifier band is shared by two memory cell blocks adjacent thereto, a gate circuit for selectively coupling a sense amplifier to a bit line pair in either one of the memory cell blocks is generally formed by an N channel MOS transistor. It is necessary that a signal level controlling such a gate circuit is at a level higher than the "H" level potential which can be generated in the bit line pair, that is, the internally boosted potential described above, in order to prevent the voltage drop in the gate circuit.

At this time, the high voltage is applied to the transistor constituting the gate circuit and the access transistor of the memory cell which is the transistor on the side of receiving the high voltage, only when these are selected.

By contrast, the transistor included in the internal power supply circuit for generating the internally boosted potential is subjected to such a high voltage for a longer period, and such a transistor operates under the severest condition considering the necessity of securing reliability.

One of the causes decreasing reliability of such a transistor operating with high voltage applied thereto is a deterioration mode caused by "hot carriers" generated in a high electric field region near the drain of the transistor.

More specifically, when a transistor is miniaturized while keeping constant the power supply voltage, electric field strength increases near the drain. Therefore, electrons flowing from the source to the drain through the channel obtains high energy from the high electric field near the drain junction, and turn to a so called "hot electrons." The hot electrons collide and are ionized near a drain end, generating electrons.holes. Though the electrons flow into the drain, part of the electrons are introduced and captured as a gate current in a gate oxide film and causes increase in threshold voltage or decrease in conductance as time passes.

Degradation of transistor characteristics caused by "hot carriers resulting from impact ionization" is said to be more likely in an N channel MOS transistor than a P channel MOS transistor. The reason for this may be the fact that electrons have higher ratio of impact ionization than holes, and that impurity profile of the drain is more steep, and hence electric field near the drain is high.

Accordingly, in a circuit for driving a high voltage such as described above, conventionally, a transistor having an electric field relaxing drain structure, for example, in order to maintain reliability of the N channel MOS transistor, a transistor having an electric field relaxing drain structure, for example, an N channel MOS transistor having an LDD (Lightly Doped Drain) structure has been sometimes used. Alternatively, a circuit configuration has been adopted in which an N channel MOS transistor having a prescribed gate potential applied thereto is interposed between a boosting node and a discharging N channel MOS transistor, so as to relax drain.source voltage.

Recently, in an LSI for image processing, for example, sometimes such a device is manufactured in that a DRAM and a logic circuit are mounted mixed on one chip.

In such a case, generally an MOS insulating film is made thin, for example, insulating film of an MOSFET is made thin (for example, insulating film thickness Tox=2 to 3 nm), in order to improve transistor performance of the logic circuit. Here, the MOS insulating film of the MOSFET in an area where the DRAM is formed is set thicker than in the logic circuit, and the insulating film thickness is Tox=6 to 7.5 nm, for example. Such a structure is referred to as a "Dual-Tox" method, as MOS insulating films of two different thicknesses are used in one LSI.

Here, up to the generation of the DRAM and the logic circuit having the minimum design dimension of 0.20 micron, an $n^+$-polysilicon gate doped with n type impurity to a high concentration has been used as a gate electrode material both in P channel and N channel MOS transistors. Such a structure of the gate electrode material is referred to as "single gate method".

In the single gate method, the N channel MOS transistor is a so called surface channel type MOS transistor, while the P channel MOS transistor is a buried channel type MOS transistor.

More specifically, in the single gate method, generally, an n type polycrystalline silicon (polysilicon) doped with a large amount of phosphorus (P) is used as the gate electrode material. Even in a polycide gate structure consisting of a stacked structure of a high melting point metal silicide and polycrystalline silicon, what is indirect contact with a gate oxide film is n type polysilicon.

When such gate electrode materials are used as the gate electrode of the N channel MOS transistor, the threshold voltage becomes lower, as there is a large difference in work function between a p type substrate and an n type polysilicon. Therefore, generally, in an N channel MOS transistor, impurities of the same conductivity as the substrate are ion-implanted to the channel region, so as to increase the threshold voltage.

When the n type polysilicon is used as the gate electrode of a P channel MOS transistor, the difference of work function between the n type substrate and the n type polysilicon is small, and therefore the threshold voltage increases in a negative direction. Therefore, when the absolute value of the threshold voltage is to be set at approximately the same value as that of the N channel MOS transistor, it becomes necessary that an impurity of an opposite conductivity to the substrate is ion-implanted to the channel region, so as to make smaller the absolute value of the threshold voltage.

As a result, in the P channel MOS transistor having the n type polysilicon as the gate electrode, a very shallow p-n junction is formed in the channel region, resulting in a buried channel type device. By contrast, the N channel MOS transistor having the n type polysilicon gate becomes a surface channel type device.

In the single gate method, the n type polysilicon is used as the gate electrode both in the N channel and P channel MOS transistors, and the threshold voltages of the N channel and P channel MOS transistors are adjusted to be approximately the same, by ion-implantation of boron to the channel region.

When such a structure is adopted, the position where the potential is the minimum is not at the Si—SiO$_2$ interface but in the substrate (well) in the P channel MOS transistor, and therefore, a buried channel is formed.

By contrast, from the generation where the circuit design rule attains 0.18 micron or smaller, a so called "dual gate method" comes to be adopted, in which the gate of the P channel MOS transistor is formed by p$^+$-polysilicon gate and the gate of N channel MOS transistor is formed by n$^+$-polysilicon.

In this case, both P and N channel MOS transistors are the surface channel type MOS transistors.

The reason why such an approach is taken is that the buried channel type device such as the conventional P channel MOS transistor is, though advantageous in that mobility increases as the carriers in the buried channel are less susceptible to the influence of surface scattering particular to the interface, disadvantageous in that short channel effect is likely. Therefore, as the gate dimension reduces, there arises the problems of decreased threshold voltage, degradation in subthreshold characteristic and decrease of punch through breakdown voltage. Possible causes of these problems include that the influence of the gate voltage becomes smaller as the channel position becomes further from the Si—SiO$_2$ interface, and that near the Si—SiO$_2$ interface, the structure along the direction of the channel is p$^+$-p-p$^+$ and there is not the p-n junction, so that the influence of the drain voltage on the channel is increased. Accordingly, it becomes necessary to have the P channel MOS transistor of surface channel type.

In this situation, that is, when a memory circuit such as the DRAM and a logic circuit are formed on one chip and the Dual-Tox method and the dual gate method are employed for the CMOS circuits constituting these circuits, the conventional transistor structure as described above may be insufficient to ensure reliability of the transistor.

An example of a transistor to which the above described high electric field is applied in a DRAM will be described in greater detail.

FIG. 38 is a schematic block diagram illustrating, where a sense amplifier SA has a so called shared amplifier configuration shared by two bit line pairs BL11, /BL11 and BL21, /BL21 in a DRAM, for example, the configurations of a gate circuit for opening/closing the connection between the bit line pairs and the sense amplifier SA and driving circuits DRBI1 and DRBI2 generating a signal BLI for controlling the gate potential of the transistor constituting the gate circuit.

Referring to FIG. 38, sense amplifier SA is connected to bit line pair BL11, /BL11 through gate transistors TG11 and TG12, respectively. Sense amplifier SA is connected to bit line pair BL21, /BL21 through gate transistors TG21 and TG22, respectively.

Gate potentials of transistors TG11 and TG12 are controlled by the signal BLI (i, 0) output from driving circuit DRBI1.

Gate potentials of transistors TG21 and TG22 are controlled by the signal BLI (i, 1) output from driving circuit DRBI2.

Driving circuit DRBI1 includes an inverter INV11 receiving a block selecting signal BSi, P channel MOS transistors TP11 and TN11 connected in series between a boosted potential Vpp and the ground potential GND, and P channel MOS transistors TP12 and TN12 connected in series between the boosted potential Vpp and the ground potential GND.

Transistor TP12 has its gate connected to a connection node of transistors TP11 and TN11, while transistor TP11 has its gate connected to a connection node of transistors TP12 and TN12.

Transistor TN11 receives at its gate a signal BSi, and transistor TN12 receives at its gate an output of inverter INV11.

Driving circuit DRBI1 further includes a P channel MOS transistor TP13 and an N channel MOS transistor TN13 connected in series between the boosted potential Vpp and the ground potential GND.

Transistor TP13 has its gate connected to a connection node of transistors TP12 and TN12, and the potential level at the connection node of transistors TP13 and TN13 is provided as the signal BLI (i, 0).

Driving circuit DRBI2 basically has the same configuration as driving circuit DRBI1. Now, when a logic and a DRAM are mounted together on one chip, the gate length of MOSFET providing the logic circuit is formed with the minimum design dimension, for example, while a transistor having the gate length longer than the minimum design dimension is used as a transistor to which a particularly high voltage is applied, in the DRAM portion 100, such as the transistor TP13.

FIG. 39 is a timing chart illustrating the operation of the circuit shown in FIG. 38.

Referring to FIG. 39, assume that the ith block is selected and the block selecting signal BSi is at an active state ("L" level) at time point t0. At time T1, in response to the signal BSI attaining to an inactive state ("H" level), transistors TN11 and TN13 in the driving circuit DRBI1 are rendered conductive.

In response, the output of inverter INV1 attains to the "L" level, and transistor TN12 is turned off. Therefore, transistor TP12 is rendered conductive, and the gate potential of transistor TP13 increases to the boosted potential Vpp. Thus, transistor TP13 attains to the off state, and the signal BLI (i, 0) attains to the ground potential GND.

At time T2, when the signal BSi attains to the active state ("L" level), transistors TN11 and TN13 in driving circuit DRBI1 are set to the off state in response. As the output level of inverter INV11 attains to the "H" level, transistor TN12 is rendered conductive. In response, transistor TP11 is rendered conductive, and the gate potential of transistor TP12 attains to the boosted potential Vpp. Thus, transistor TP12 is turned off. In response, gate potential of transistor TP13 attains to the ground potential GND, and therefore, transistor TP13 is rendered conductive and the signal BLI (i, 0) attains to the boosted potential Vpp.

The output level of driving circuit DRBI2 which is not in the selected state, is kept at the "L" level.

In such a configuration, P channel MOS transistors TP13 and the like make transition between a state where a potential corresponding to the potential difference between the ground potential GND and the boosted potential Vpp is applied between the source and drain (off state) and a state where the potential difference between the source and the drain is almost eliminated (conductive state).

Here, the transistor TP13 in driving circuit DRBI1 is required to drive, at one time, a plurality of gate transistors (in FIG. 38, only two gate transistors are shown as representatives) existing in the memory cell block, and therefore, it must have a relatively large driving force. Therefore, the time period from the state where the transistor TP13 is in the off state with the ground potential GND and the boosted potential Vpp applied between the source and the drain thereof until the potential difference between the source and the drain of transistor TP13 becomes small is longer than in transistors TP11 and TP12. Therefore, transistors TP13 and the like are kept in such a state in that channel current flows while a larger source.drain voltage Vds is applied.

In the LSI having the DRAM and the logic circuit mounted together, when the CMOS transistor has the dual gate structure and the Dual-Tox method is employed, there is a possibility that sufficient reliability of the P channel MOS transistor such as the transistor TP13 that has been considered less susceptible to degradation in reliability caused by hot carriers, cannot be ensured if such a voltage stress is applied.

SUMMARY OF THE INVENTION

An object of the present invention is to provide a semiconductor integrated circuit device capable of ensuring, in a circuit that must drive a relatively high voltage, reliability of a transistor pulling up the voltage.

Briefly stated, the present invention provides a semiconductor integrated circuit device including a logic circuit portion, a voltage down converting circuit, a boosting circuit and a memory portion.

The logic circuit portion operates at the ground potential and a first power supply potential.

The voltage down converting circuit generates, from an external power supply potential, a second power supply potential by down-converting the external power supply potential. The boosting circuit generates a boosted potential, from the external power supply potential, by boosting the external power supply potential.

The memory portion operates at least at the ground potential and the internal power supply potential and the boosted potential, and transmits/receives data to and from the logic circuit portion.

The memory portion includes a plurality of memory cells and a driving circuit. The plurality of memory cells are arranged in a matrix of rows and columns. The plurality of memory cells are each capable of storing any of at least two levels corresponding to the ground potential and the second internal power supply potential.

The driving circuit operates upon reception of the boosted potential and, at least in a data reading operation from the memory cell, generates an internal control signal having a level corresponding to the boosted potential, for controlling the reading operation.

The driving circuit has an output node for outputting an internal control signal, and a surface channel type N channel MOS transistor provided between the output node and the boosted potential, for pulling up the potential level of the output node.

According to another aspect, the present invention provides a semiconductor integrated circuit device including a logic circuit portion, a voltage down converting circuit, a boosting circuit and a memory portion.

The logic circuit portion operates at the ground potential and the first power supply potential.

The voltage down converting circuit generates a second power supply potential from an external power supply potential, by down-converting the external power supply potential. The boosted circuit generates a boosted potential from the external power supply potential, by boosting the external power supply potential.

The memory portion operates at least at the ground potential and the second internal power supply potential and the boosted potential, and transmits/receives data to and from the logic circuit portion.

The memory portion includes a plurality of memory cells and a driving circuit.

The plurality of memory cells are arranged in a matrix of rows and columns. The plurality of memory cells are each capable of storing any of at least two levels corresponding to the ground potential and the second internal power supply potential.

The driving circuit operates receiving the boosted potential, and generates, at least in the data reading operation from the memory cell, an internal control signal having a level corresponding to the boosted potential, for controlling the reading operation.

The driving circuit has an output node for outputting the internal control signal, and a buried channel type P channel MOS transistor for pulling up the potential level of the output node.

According to a still further aspect, the present invention provides a semiconductor integrated circuit device including a logic circuit portion, a voltage down converting circuit, a boosting circuit and a memory portion.

The logic circuit portion operates at the ground potential and a first power supply potential.

The voltage down converting circuit generates a second power supply potential from an external power supply potential, by down-converting the external power supply potential. The boosting circuit generates a boosting potential from the external power supply potential, by boosting the external power supply potential.

The memory portion operates at least at the ground potential and the second internal power supply potential and the boosted potential, and transmits/receives data to and from the logic circuit portion.

The memory portion includes a plurality of memory cells and a driving circuit.

The plurality of memory cells are arranged in a matrix of rows and columns. The plurality of memory cells are each capable of storing any of at least two levels corresponding to the ground potential and the second internal power supply potential.

The driving circuit operates upon reception of the boosted potential, and at least in the data reading operation from the memory cell, generates an internal control signal having a level corresponding to the boosted potential, for controlling the reading operation.

The driving circuit has an output node for outputting the internal control signal, and an LDD type P channel MOS transistor provided between the output node and the boosted potential, for pulling up the potential level of the output node.

According to a still further aspect, the present invention provides a semiconductor integrated circuit device including a logic circuit portion, a voltage down converting circuit, a boosting circuit and a memory portion.

The logic circuit portion operates at the ground potential and a first power supply potential.

The voltage down converting circuit generates a second power supply potential from the external power supply potential, by down-converting the external power supply potential. The boosting circuit generates a boosted potential from the external power supply potential, by boosting the external power supply potential.

The memory portion operates at least at the ground potential and the second internal power supply potential and the boosted potential, and transmits/receives data to and from the logic circuit portion.

The memory portion includes a plurality of memory cells, a driving circuit, a sense amplifier band, a word line driving circuit band, a signal line, a plurality of P channel pull up transistors, and a gate circuit.

The plurality of memory cells are each capable of storing any of at least two levels corresponding to the ground potential and the second internal power supply potential, respectively, and arranged in a matrix of rows and columns. The plurality of memory cells are arranged divided into a plurality of memory cell blocks along the column direction.

The driving circuit operates upon reception of the boosted potential, and generates, at least in the data reading operation from the memory cell, an internal control signal having a level corresponding to the boosted potential, for controlling the reading operation.

The sense amplifier band is provided commonly corresponding to every adjacent pair of memory cell blocks among the plurality of memory cell blocks, and arranged along the row direction for amplifying data read out from the memory cells within the selected memory cell block. The word line driving circuit band is provided along the column direction for every prescribed number of memory cell columns.

The signal line transmits the internal control signal. The plurality of P channel pull up transistors are provided at every intersecting area between the word line driving circuit band and the sense amplifier band, and drive the first signal line level to the boosted potential, in response to activation of the internal control signal.

The gate circuit selectively couples the sense amplifier band with a corresponding memory cell block. The gate circuit includes a plurality of N channel MOS transistors controlled by the potential level of the signal line, for opening/closing coupling between the memory cell block and the sense amplifier portion.

Therefore, a main advantage of the present invention is that at least in the period when a high voltage is applied between the source.drain of the pull up transistor, in driving the internal control signal of the boosted potential level, the potential is pulled up by the N channel MOS transistor. Therefore, degradation of reliability caused by "channel hot carriers" can be suppressed.

Another advantage of the present invention is that, in driving the internal control signal of the boosted potential level, the potential is pulled up by a P channel MOS transistor having such a structure that has immunity to "channel hot carriers", and therefore degradation of reliability caused by "channel hot carriers" can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
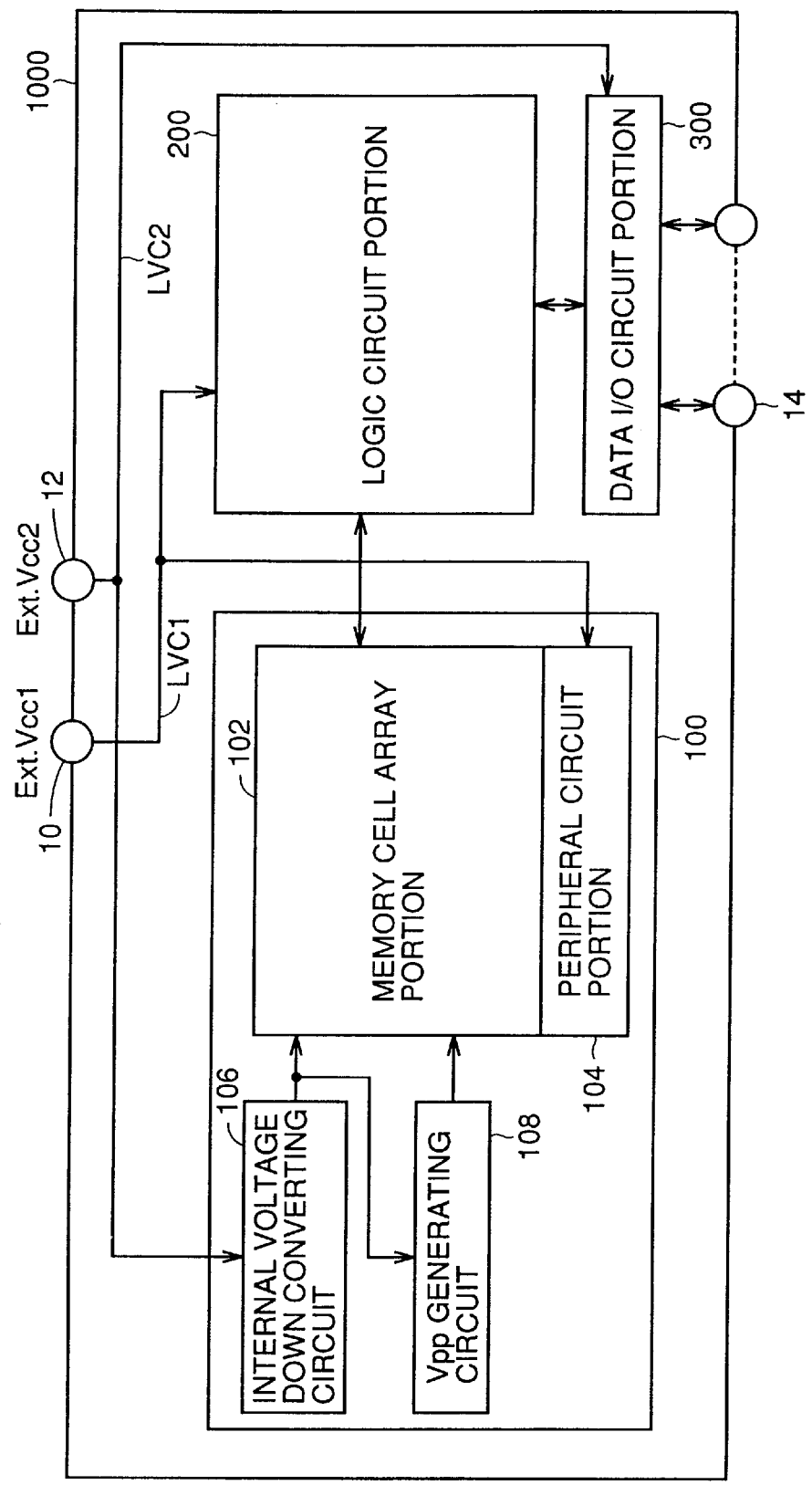
FIG. 1 is a schematic block diagram representing a configuration of a semiconductor integrated circuit device 1000 in accordance with a first embodiment of the present invention.

FIG. 1 is a schematic block diagram representing the configuration of the semiconductor integrated circuit device 1000 in accordance with the first embodiment of the present invention.

Referring to FIG. 1, semiconductor integrated circuit device 1000 includes a power supply terminal 10 for receiving an external power supply potential Ext.Vcc1 of a relatively low voltage (for example, 1.5V), and a second power supply terminal 112 for receiving an external power supply potential Ext.Vcc2 higher than the external power supply potential Ext.Vcc1. Here, it is assumed that external power supply potential Ext.Vcc2 is, for example, 3.3V.

Semiconductor integrated circuit device 1000 further includes a DRAM portion 100 operating upon reception of the ground potential GND, external power supply potential Ext.Vcc1 and external power supply potential Ext.Vcc2, a logic circuit portion 200 operating upon reception of the ground potential GND and external power supply potential Ext.Vcc1, and a data I/O circuit portion 300 operating upon reception of the ground potential GND and external power supply potential Ext.Vcc2, for transmitting/receiving data to and from the logic circuit portion 200 and data input/output terminal 14.

DRAM portion 100 includes: a memory array portion 102 including memory cells for holding data arranged in a matrix of rows and columns; a peripheral circuit portion 104 operating upon reception of external power supply potential Ext.Vcc1, for controlling data input/output operation to and from the memory cell array portion 102; an internal voltage down converting circuit 106 receiving and down-converting the external power supply potential Ext.Vcc2 to generate a down-converted potential (for example, 1.8V); and a Vpp generating circuit 108 receiving an output of internal voltage down converting circuit 106 and generating a boosted potential (for example, 3.5V).

It is assumed that the minimum design rule of the DRAM portion 100, logic circuit portion 200 and the like shown in FIG. 1 is at most 180 nm (0.18 micron). Further, it is assumed that the transistors constituting semiconductor integrated circuit device 1000 are in accordance with "dual gate method" and "Dual-Tox method", except for the transistors for driving the boosted potential, as will be described later.

Figure 2:
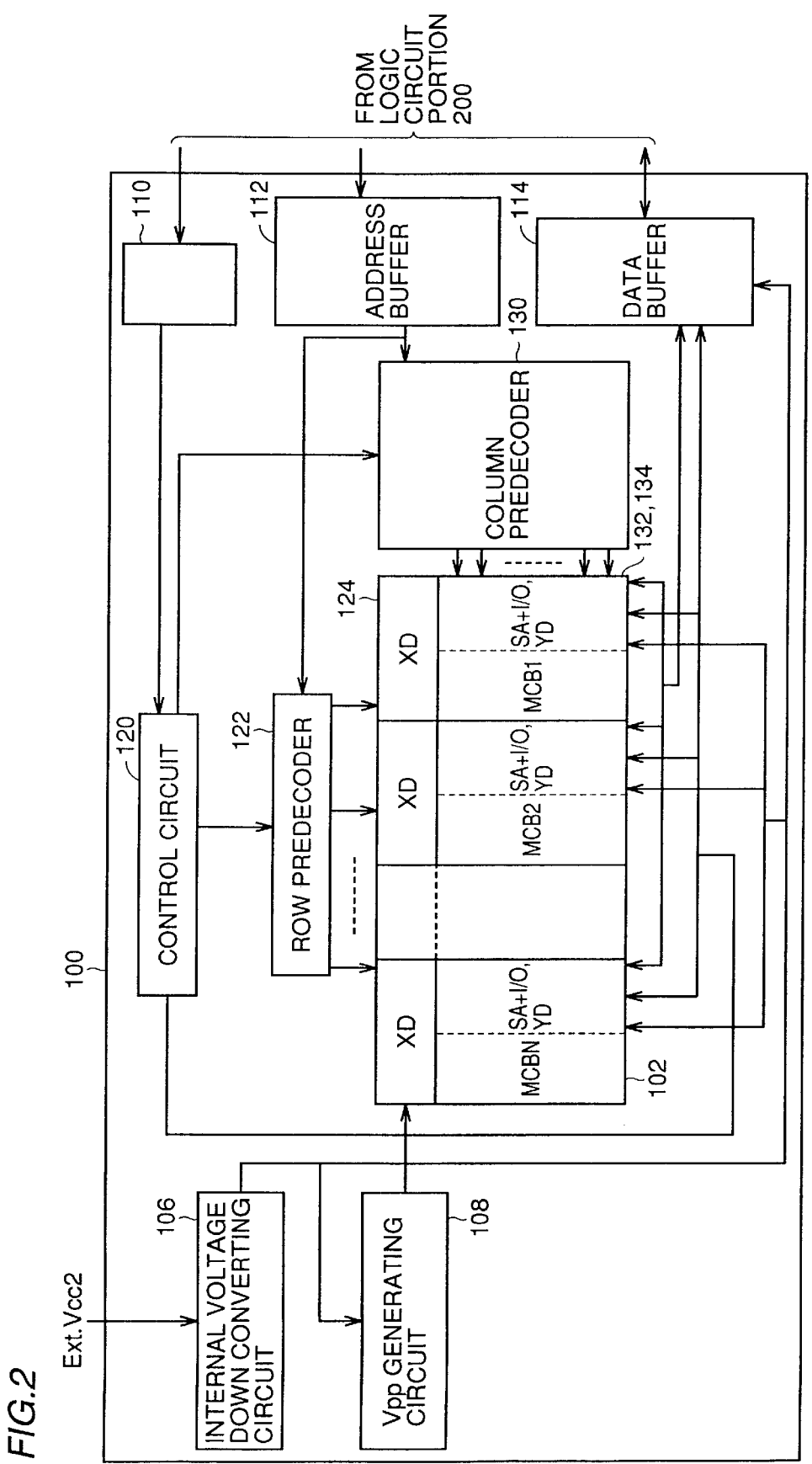
FIG. 2 is a schematic block diagram representing a configuration of a DRAM portion 100.

FIG. 2 is a schematic block diagram representing the configuration of DRAM portion 100 shown in FIG. 1.

The DRAM portion 100 includes: a control signal input buffer 100 receiving control signals from logic portion 200, for example, a row address strobe signals /RAS, a column address strobe signal /CAS and a write enable signal /WE; an address buffer 112 for receiving an address signal applied for designating a memory cell to be accessed from logic portion 200; and a data buffer 114 for transmitting/receiving data to and from the logic portion 200. Here, data buffer 114 receives and operates with the output of internal voltage down converting circuit 106.

The DRAM portion 100 further includes: a control circuit 120 receiving a control signal from control signal input buffer 110 for controlling an operation of the DRAM portion 100; a row predecoder 122 controlled by control circuit 120, receiving a row address signal from address buffer 112 for generating a predecode signal; a row decoder (XD) 124 receiving an output from row predecoder 122 for selecting any of the rows; a column predecoder 130 controlled by control signal 120, receiving a column address signal from address buffer 112 for generating a predecode signal; a column decoder 132 for selecting a corresponding column (bit line pair) of the memory cell block based on the column predecode signal from column predecoder 130; a sense amplifier SA provided corresponding to each bit line pair, for amplifying data stored in the selected memory cell; and an I/O circuit for selectively transmitting data from the bit line pair selected by the column decoder 100 to data buffer 114. In FIG. 2, column decoder (YD) 132 and sense amplifier and I/O circuit 134 are represented collectively by one block for convenience. The memory cell in the memory cell array 102 designated by row decoder 124 and column decoder 134 communicates data with logic circuit portion 200 through sense amplifier+I/O circuit 132 and input/output buffer 114.

As shown in FIG. 2, memory array 102 is divided into N memory cell blocks MCB1 to MCBN.

Internal voltage down converting circuit 106 generates an internal power supply potential (for example, 1.8V) from external power supply potential Ext.Vcc2 (for example, 3.3V), and supplies the generated potential to sense amplifier SA and data buffer 114. Vpp generating circuit 108 generates the boosted potential Vpp from internal power supply potential and, as will be discussed later, supplies the generated potential to the word line driving circuitry and BLI driving circuitry.

The configuration of the DRAM portion 100 shown in FIG. 2 is only a representative example, and the present invention is generally applicable even when other configuration of the dynamic semiconductor memory device is used for the DRAM portion. For example, the manner of division of the memory cell array is not limited to the example of FIG. 2.

Figure 3:
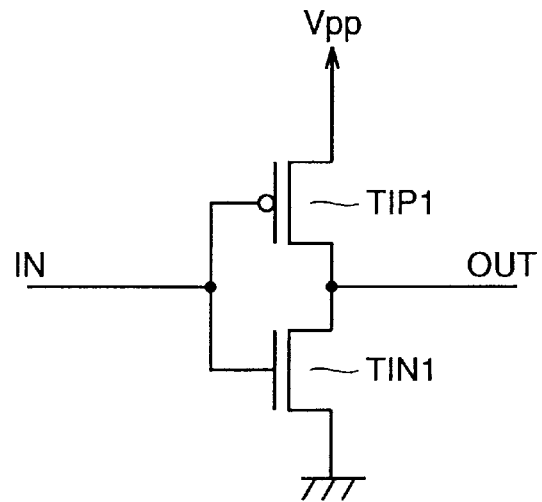
FIG. 3 shows a configuration of an inverter INV1 operating at a boosted potential Vpp.
Figure 4:
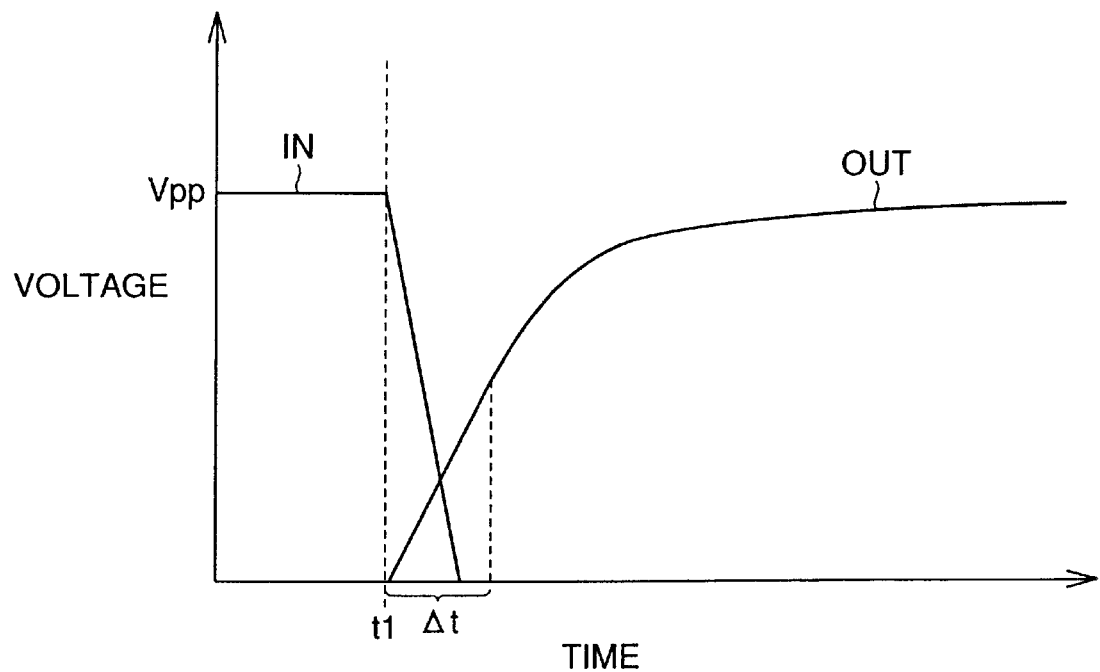
FIG. 4 shows an input/output waveform of the inverter shown in FIG. 3.

FIG. 3 shows a configuration of inverter INV1 operating at the boosted potential Vpp used, for example, in row decoder 124 shown in FIG. 2, and FIG. 4 shows an input/output waveform of such an inverter.

Inverter INV1 includes a P channel MOS transistor TIP1 and an N channel MOS transistor TIN1 connected in series between the boosted potential Vpp and the ground potential GND.

Referring to FIGS. 3 and 4, when the input signal IN starts to change from "H" level to "L" level at time t1, the level of the output signal OUT also starts to change from the "L" level to "H" level in response. At this time, for the inverter portion operating at the amplitude of boosted potential Vpp, a thick oxide film (Tox=6 to 7.5 nm) in accordance with the Dual-Tox method is typically used. The circuit including such a transistor that has the thick oxide film suffers from the problem of "channel hot carrier" reliability, as will be discussed below.

The channel hot carrier reliability refers to the variation in the threshold value or the variation in source/drain current Ids caused by the hot carriers generated in the channel of a MOS transistor.

Degradation in reliability caused by the channel hot carriers is strongly dependent on the drain-gate voltage (the phenomenon is more noticeable when the voltage increases).

Therefore, in the graph shown in FIG. 4, degradation in reliability is most significant under the bias condition when, at the start of turning on the P channel MOS transistor TIP1, the gate potential begins to change while the drain voltage is still maintained at a large value. More specifically, degradation is most significant in the period of time point t1 to time t1+Δt in FIG. 4.

Such a phenomenon is the most significant at a circuit portion where the signal amplitude is large (for example, Vpp amplitude) and it is necessary to drive a large load capacitance, that is, the most significant where the fan out is large.

Further, the phenomenon is more noticeable in a P channel MOS transistor than in an N channel MOS transistor and further, more noticeable in a surface channel type transistor than the buried channel type transistor.

Figure 5:
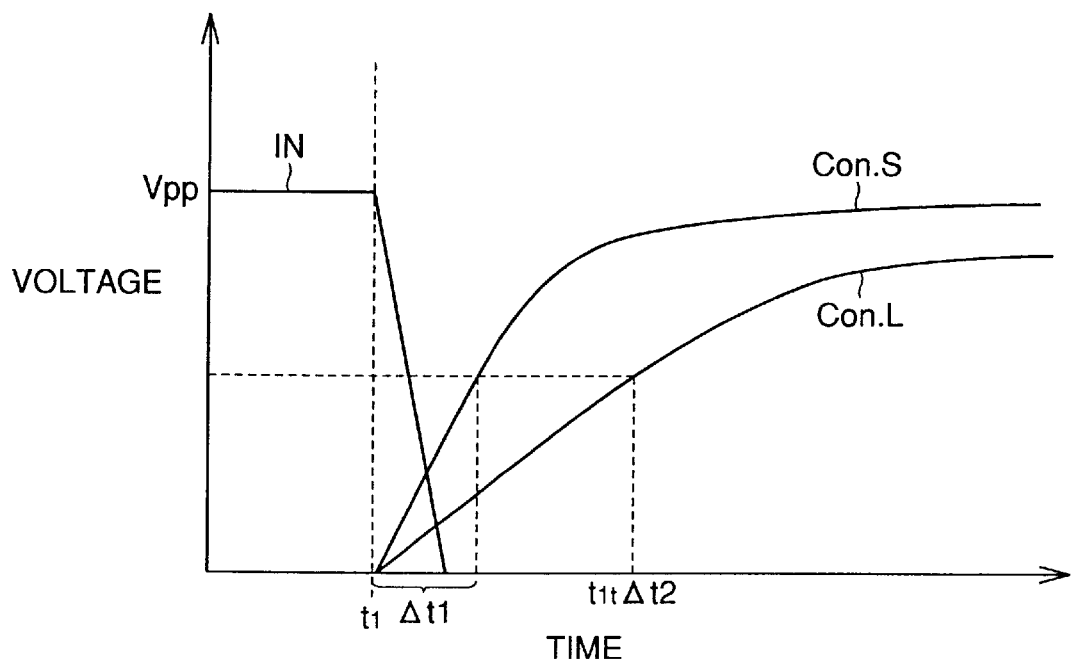
FIG. 5 shows a fan out dependency of the input/output waveform of the inverter shown in FIG. 3.

FIG. 5 shows a fan out dependency of the input/output waveform of the inverter shown in FIG. 3.

More specifically, degradation by the channel hot carriers is more significant in a circuit in which transistor fan out is large and the timing necessary for the transition of the output potential level from "L" to "H" is longer.

More specifically, when the fan out is small, the time change of the output signal with respect to the change of an input signal IN is relatively steep as represented by the curve Con.S in FIG. 5, and therefore, the time period in which the gate potential of P channel MOS transistor has changed while the drain voltage is maintained at a large value is, for example, from time point t1 to t1+Δt1. By contrast, when the fan out is large, the time change of the output signal with respect to the change in the input signal IN is relatively moderate as represented by the curve Con.L in FIG. 5. Therefore, the time period in which the gate potential of P channel MOS transistor has changed while the drain voltage is maintained at a large value is, for example, from t1 to 1+Δt2. Therefore, it is the case that when the fan out is large, the P channel MOS transistor is exposed longer to the degradation caused by "channel hot carriers".

Figure 6A:
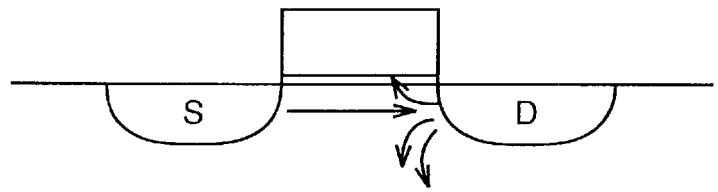
FIG. 6A is a schematic diagram representing the conventionally known degradation of reliability caused by hot carriers, and FIG. 6B schematically represents the degradation of reliability caused by "channel hot carriers."
Figure 6B:
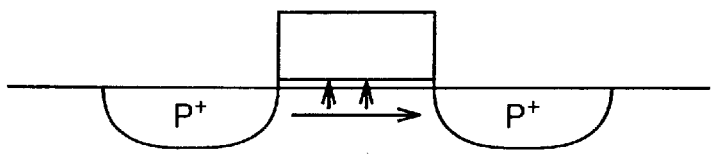

FIGS. 6A and 6B are illustrations schematically representing the relation between degradation in reliability caused by hot carriers as conventionally known, and the degradation of reliability caused by "channel hot carriers."

As can be seen from FIG. 6A, degradation in reliability of the transistor caused by the general hot carriers occurs due to the generation of electron.hole pairs by impact ionization, near the drain end having high electric field intensity.

By contrast, degradation in reliability caused by "channel hot carriers" occurs significantly when the transistor starts to change from the off to on state, that is, in a state where the source/drain voltage is large and the channel current starts to flow as shown in FIG. 6B and described above.

Figure 7:
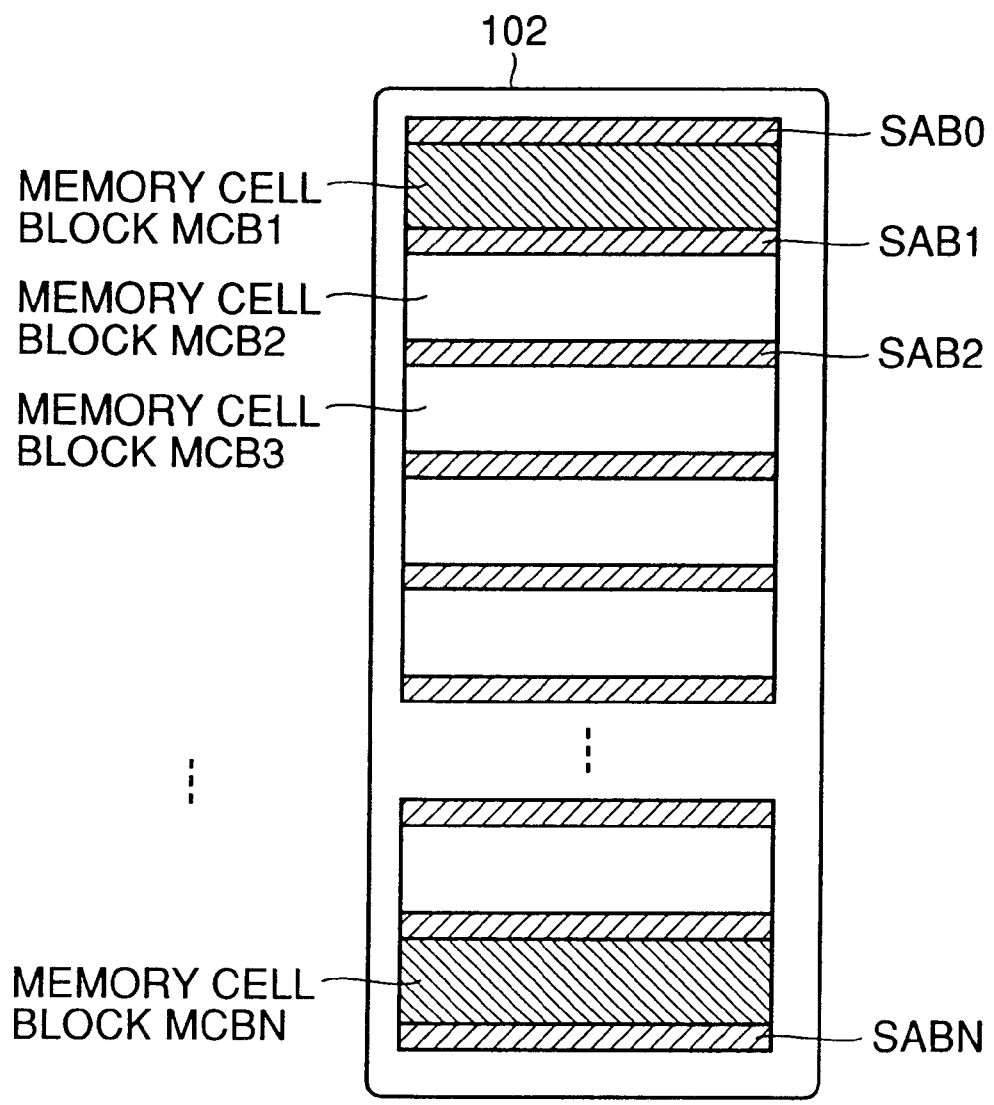
FIG. 7 is a schematic diagram representing a configuration of a memory cell array 102.

FIG. 7 is a schematic diagram representing a configuration of memory cell array 102 shown in FIG. 1. Referring to FIG. 7, the memory cell array is divided into N memory cell blocks MCB1 to MCBN, and sense amplifier bands SAB0 to SABN are shared by adjacent memory cell blocks. At this time, as will be described later, a plurality of bit line pairs in memory cell block MCB2 are so arranged as to be coupled to sense amplifiers in sense amplifier band SAB1 or sense amplifier band SAB2, alternately.

Figure 8:
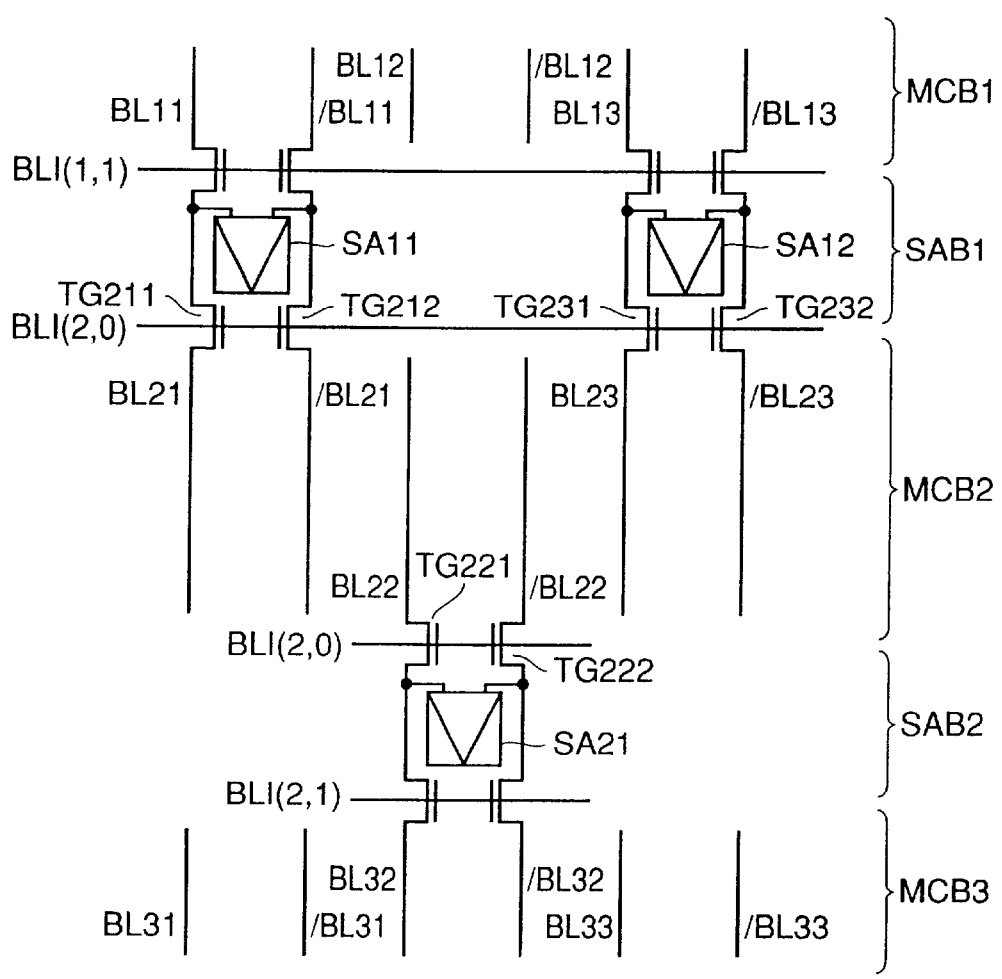
FIG. 8 is a circuit diagram representing extracted configurations of memory cell block MCB2 and sense amplifier bands SAB1 and SAB2.

FIG. 8 is a circuit diagram extracting the configurations of memory cell block MCB2 and sense amplifier bands SAB and SAB2 shown in FIG. 7.

FIG. 8 extracts and shows bit line pairs BL21, /BL21, BL22, /BL22 and BL23, /BL23, of memory cell block MCB2.

The pair of bit lines BL21 and /BL21 can be electrically coupled to sense amplifier SA in sense amplifier band SAB1 through N channel MOS transistors TG211 and TG212, respectively. The pair of bit lines BL22 and /BL22 next to the pair of bit lines BL21 and /BL21 can be electrically coupled to sense amplifier SA21 in sense amplifier band SAB2 through N channel MOS transistors TG221 and TG222, respectively. Further, the pair of bit lines BL23 and /BL23 next to the pair of bit lines BL22 and /BL22 can be electrically coupled to sense amplifier SA12 in sense amplifier band SAB1 through N channel MOS transistors TG231 and TG232, respectively.

Gate potentials of transistors TG211 and TG212, TG221 and TG222 as well as TG231 and TG232 are driven by the signal BLI (2, 0).

Figure 9:
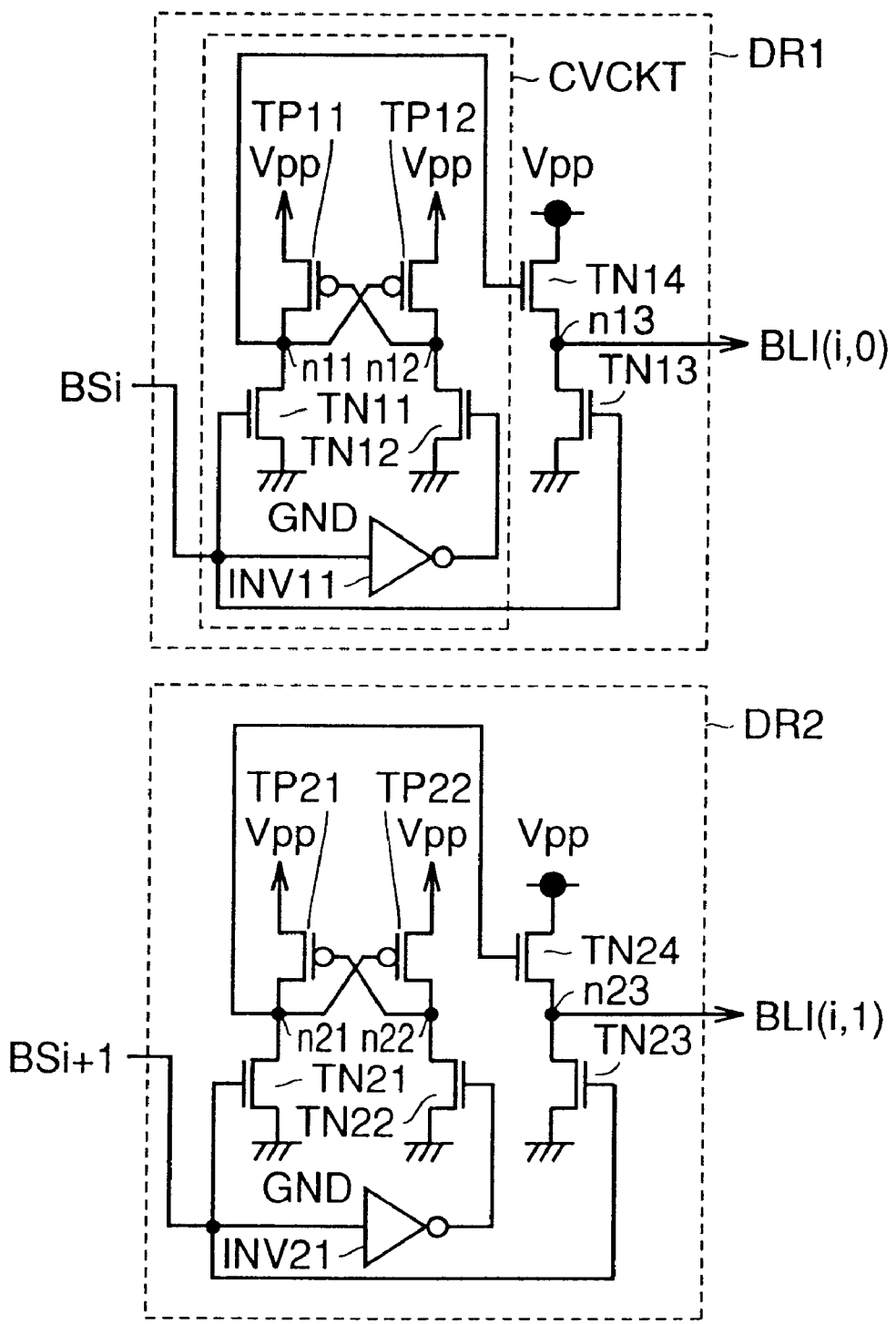
FIG. 9 is a schematic block diagram representing the configurations of driving circuits DR1 and DR2.

FIG. 9 is a schematic block diagram representing the configurations of driving circuits DR 1 and DR2 for generating the signals BLI (i, 0) and BLI (i, 1) (i: natural number) shown in FIG. 8.

Referring to FIG. 9, driving circuit DR1 includes an inverter INV11 receiving a block selecting signal BSi, P channel MOS transistors TP11 and TN11 connected in series between boosted potential Vpp and the ground potential GND, and P channel MOS transistors TP12 and TN12 connected in series between the boosted potential Vpp and the ground potential GND.

Transistor TP12 has its gate connected to a connection node n11 of transistors TP11 and TN11, and transistor TP11 has its gate connected to a connection node n12 of transistors TP12 and TN12. Transistor TN11 receives at its gate the signal BSi, and transistor TN12 receives at its gate an output of inverter INV11.

Driving circuit DR1 further includes N channel MOS transistors TN14 and TN13 connected in series between the boosted potential Vpp and the ground potential GND.

Transistor TN14 has its gate connected to the connection node n11 of transistors TP11 and TN11, and a potential level at the connection node of transistors TN14 and TN13 is output as the signal BLI (i, 0).

Driving circuit DR2 basically has the same structure as driving circuit DR1.

Figure 10:
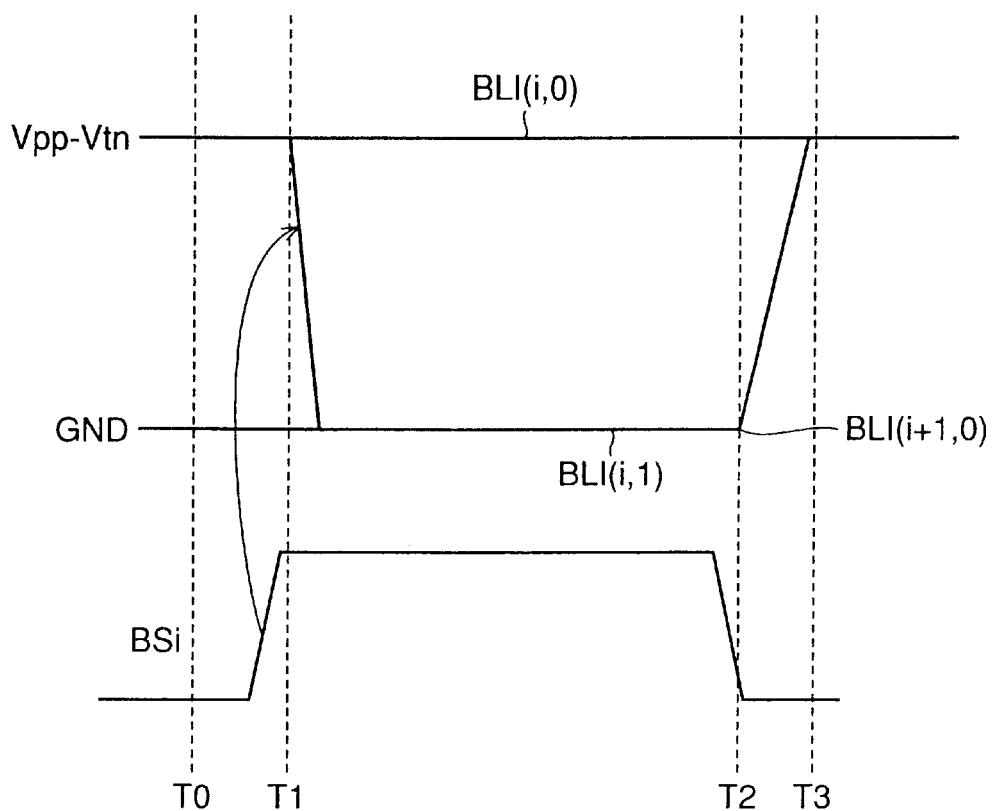
FIG. 10 is a timing chart representing the operation of the circuits shown in FIG. 9.

FIG. 10 is a timing chart representing the operation of the circuit shown in FIG. 9. In the following, it is assumed that the transistor TN14 has a threshold voltage of Vtn.

Referring to FIG. 10, it is assumed that at time T0, ith block is selected and the block selecting signal BSi is at the active state ("L" level).

At time T1, in response to the signal BSi attaining to the inactive state ("H" level), transistors TN11 and TN13 in driving circuit DR1 are rendered conductive. In response, potential levels of nodes n11 and n12 decrease toward the ground potential.

The output of inverter INV11 attains to the "L" level, and transistor TN12 is turned off. Transistor TP12 is rendered conductive as the potential level at node n11 lowers, and the potential at node n12 increases to the boosted potential Vpp. Conversely, the potential level of node n11 decreases, and therefore transistor TN14 is turned off. Thus, signal BLI (i, 0) attains to the ground potential GND.

At time T2, when the signal BSi again attains to the active state ("L" level), transistors TN11 and TN13 in driving circuit DR1 are turned off in response. As the output level of inverter INV11 attains to "H", transistor TN12 is rendered conductive. In response, the potential level at node n12 decreases toward the ground potential GND. Transistor TP11 is rendered conductive and the gate potential of transistor TP12 attains to the boosted potential Vpp, and therefore transistor TP12 is turned off. On the other hand, in response to the potential level at node n11 attaining to the boosted potential Vpp, the gate potential of transistor TN14 also attains to the boosted potential Vpp, and therefore, transistor TN14 is rendered conductive and the signal BLI (i, 0) attains to the boosted potential (Vpp−Vtn).

The output level of driving circuit DR2 which is not in the selected state is kept at the "L" level.

In such a structure, what drives the potential of node n13 providing the signal BLI (i, 0) to the high potential (Vpp−Vtn) is the N channel MOS transistor TN14. Therefore, degradation in characteristic by "channel hot carriers" in this transistor can be suppressed.

Here, transistor TN14 in driving circuit DR1 must drive, at one time, a plurality of gate transistors in the memory cell block (in FIG. 8, only the transistors TG211 to TG233 are shown as representatives), and therefore, the transistor must have a relatively large driving force.

The time period from a state where transistor TN14 is off and the ground potential and the booster potential Vpp are applied between the source and the drain thereof until a state where the potential difference between the source and the drain of transistor TN14 decreases is longer than in transistor TP11 or TP12. By the fact that transistor TN14 is an N channel MOS transistor, however, degradation in reliability caused by "channel hot carriers" can be suppressed.

[Second Embodiment]

Figure 11:
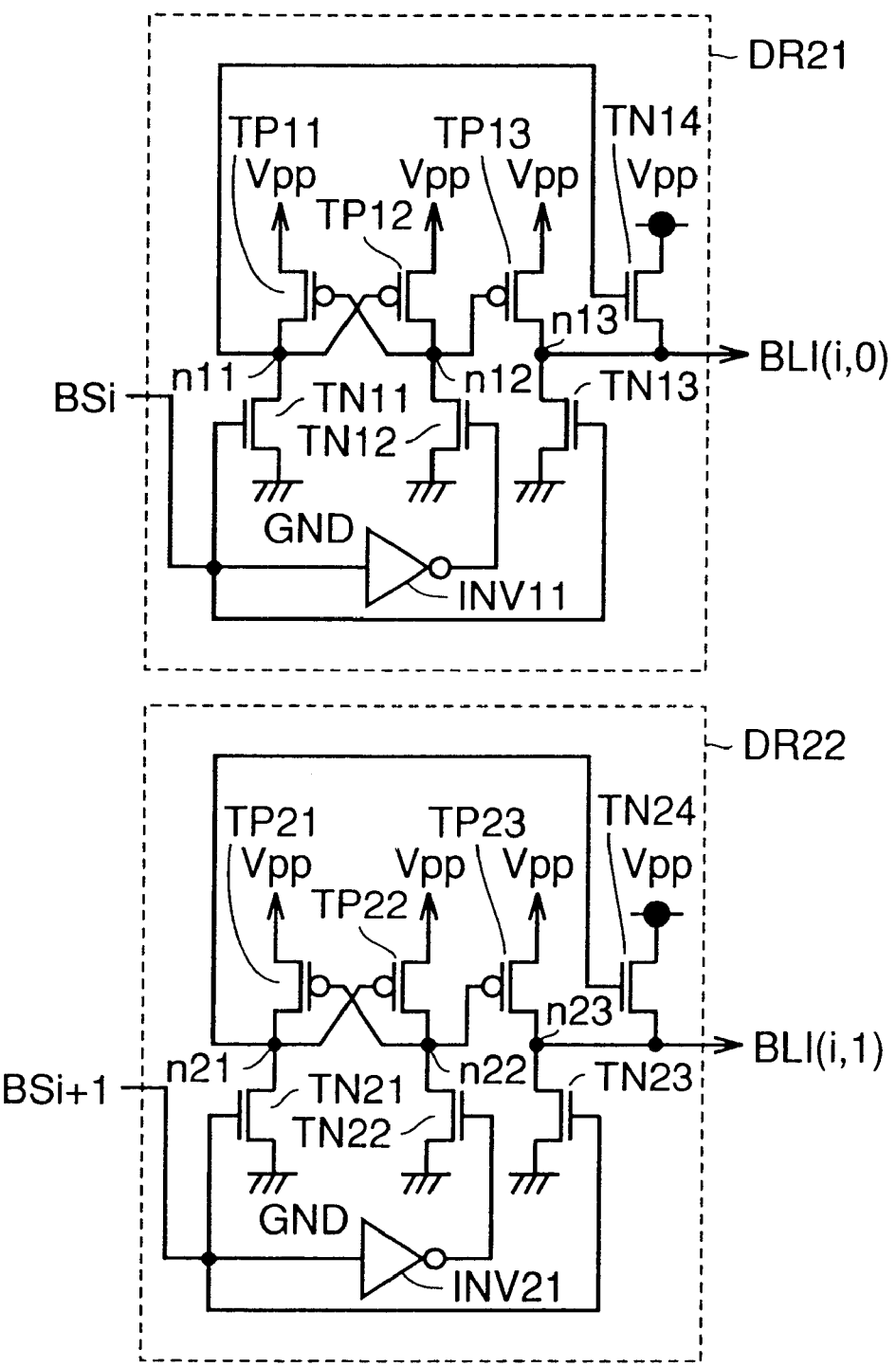
FIG. 11 is a schematic block diagram representing configurations of driving circuits DR21 and DR22.

FIG. 11 is a schematic block diagram representing configurations of driving circuits DR21 and DR22 for generating the signals BLI (i, 0) and BLI (i, 1) (i; natural number) in accordance with the second embodiment of the present invention.

The configuration of driving circuit DR21 differs from the driving circuit DR1 of the first embodiment shown in FIG. 9 in that a P channel MOS transistor TP13 is provided between the boosted potential Vpp and the node n13 providing the signal BLI (i, 0). Transistor TP13 has its gate connected to node n12.

Therefore, in driving circuit DR21, the signal BLI (i, 0) is driven from the ground potential GND to the boosted potential Vpp by transistor TP13.

Driving circuit DR22 basically has the same configuration as driving circuit DR21.

Figure 12:
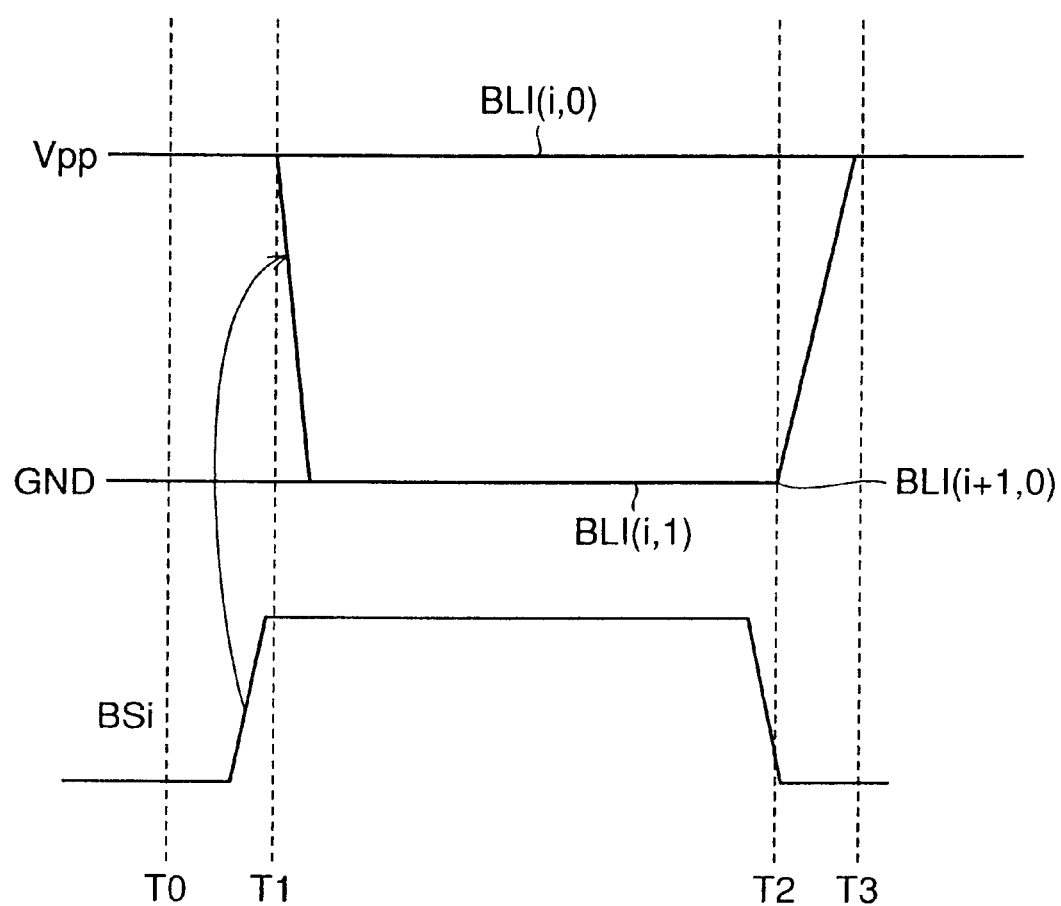
FIG. 12 is a timing chart representing the operation of the circuits shown in FIG. 11.

FIG. 12 is a timing chart representing the operation of the circuit shown in FIG. 11.

The operation is the same as that of the driving circuit DR1 in accordance with the first embodiment shown in FIG. 9 except that when the signal BSi is at the active state ("L" level), transistors TP13 and TN14 are both rendered conductive, so that the signal BLI (i, 0) increases to the boosted potential Vpp. Therefore, description thereof is not repeated.

By adopting the structure shown in FIG. 11, it becomes possible to render conductive the gate transistors TG211 and TG212 sufficiently to eliminate the influence of voltage drop, without the necessity of boosting the boosted level Vpp to such a high level as in the first embodiment.

Further, when the potential of node n13 is to be increased, both N channel MOS transistor TN14 and P channel MOS transistor TP13 are used for driving. Therefore, degradation in driveability of P channel MOS transistor TP13 caused by "channel hot carriers" can be suppressed.

[Third Embodiment]

Figure 13:
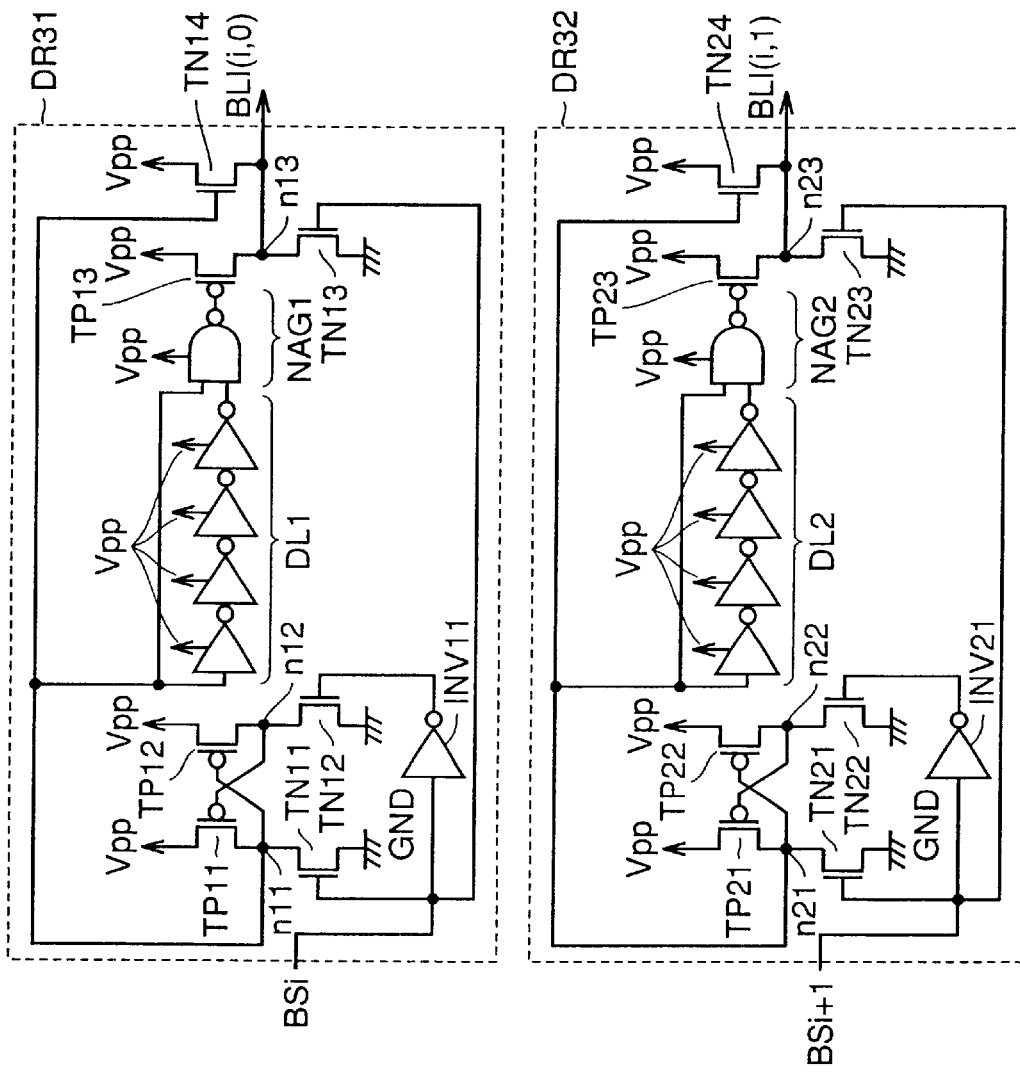
FIG. 13 is a schematic block diagram representing configurations of driving circuits DR31 and DR32.

FIG. 13 is a schematic block diagram representing the configurations of driving circuits DR31 and DR32 for generating the signals BLI (i, 0) and BLI (i, 1) (i: natural number) in accordance with the third embodiment of the present invention.

The configuration of driving circuit DR31 differs from that of the driving circuit DR21 in accordance with the second embodiment shown in FIG. 1 in the following points.

Driving circuit DR31 includes a delay circuit DL1 receiving as an input the potential level of node n11 and including an even-numbered stages (in FIG. 13, 4 stages) of inverters connected in series with each other, and an NAND gate NAG1 having input nodes connected to an output node of delay circuit DL1 and node n11. In driving circuit DR31, the gate of P channel MOS transistor TP13 is connected not to the node n12 but to an output node of NAND circuit NAG1. Here, the inverters constituting the delay circuit DL1 and NAND circuit NAG1 all operate receiving the ground potential GND and the boosted potential Vpp. Here, the signal delay time in delay circuit DL1 is represented as TD.

Therefore, in the driving circuit DR31, in response to the potential level at node n11 reaching the boosted potential Vpp, first, N channel MOS transistor TN14 is rendered conductive to start raising the potential level of node n13 and, after the lapse of the delay time ΔTD, P channel MOS transistor TP13 is rendered conductive and further increases, together with transistor TN14, the potential level of node n13.

Driving circuit DR32 basically has the same configuration as driving circuit DR31.

Figure 14:
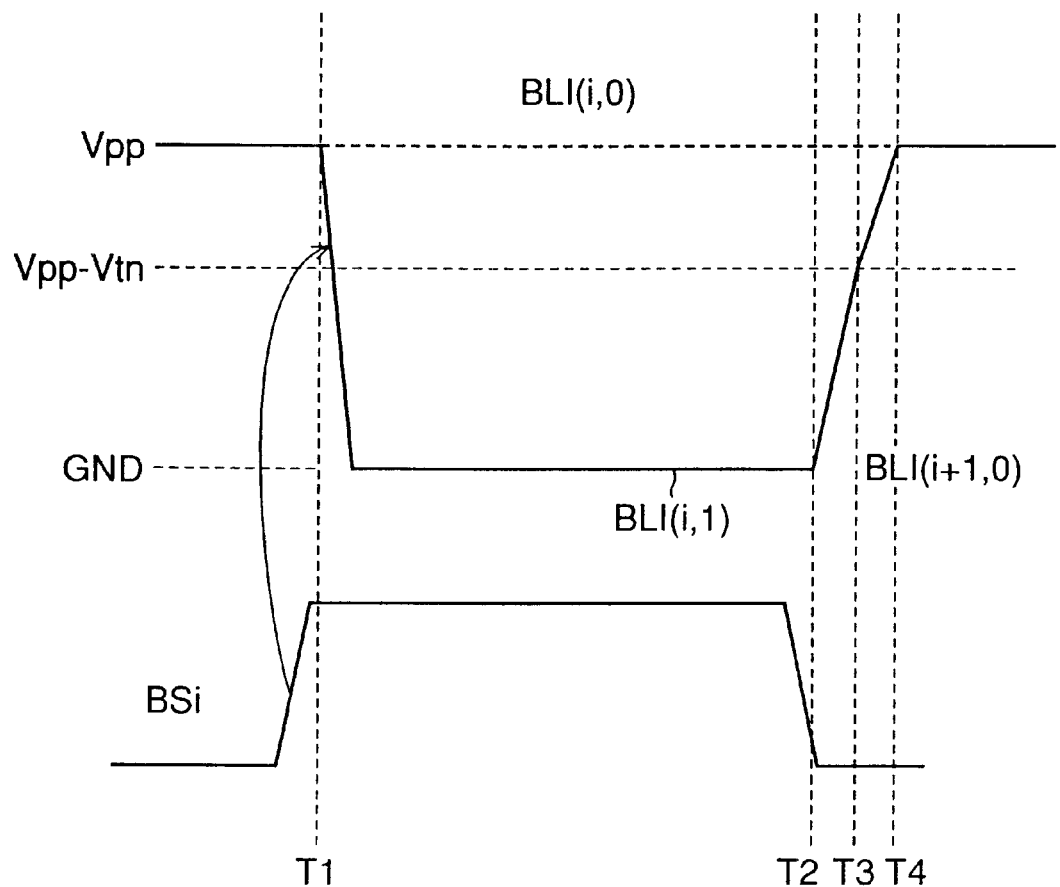
FIG. 14 is a timing chart representing the operation of circuit DR31.

FIG. 14 is a timing chart representing the operation of the circuit DR31 shown in FIG. 13.

Referring to FIG. 14, it is assumed that at time T0, the ith block is selected and the block selecting signal BSI is at the active state ("L" level). Therefore, at time T0, the potential levels at the input nodes of NAND circuit NAG1 are both at the "H" level, and therefore the output of NAND circuit NAG1 is at the "L" level and transistor TP13 is conductive.

At time T1, in response to the signal BSi attaining to the inactive state ("H" level), transistors TN11 and TN13 in driving circuit DR31 are rendered conductive. In response, potential levels at nodes n11 and n12 decrease to the ground potential.

On the other hand, the output of inverter INV11 attains to the "L" level, and transistor TN12 is turned off. Transistor TP12 is rendered conductive as the potential level of node n11 decreases, and the potential of node n12 increases to the boosted potential Vpp. Conversely, as the potential level of node n11 decreases, the potential level of one input node of NAND circuit NAG1 attains to "L", the output level of NAND circuit NAG1 attains to "H" in response, and transistor TP13 is turned off. Further, as the potential level of node n11 decreases, transistor TN14 is turned off and the signal BSi attains to the "H", whereby transistor TN13 is rendered conductive. Thus, the signal BLI (i, 0) attains to the ground potential GND.

At time T2, when the signal BSi again attains to the active state ("L" level), transistors TN11 and TN13 in driving circuit DR31 are turned off in response. As the output level of inverter INV11 attains to the "H" level, transistor TN12 is rendered conductive. In response, the potential level of node n12 decreases toward the ground potential GND. Transistor TP11 is rendered conductive and the gate potential of transistor TP12 attains to the boosted potential Vpp. Therefore, transistor TP12 is turned off. On the other hand, as the potential level of node n11 attains to the boosted potential Vpp, the gate potential of transistor TN14 also attains to the boosted potential Vpp, so that transistor TN14 is rendered conductive and the signal BLI (i, 0) increases to a boosted potential (Vpp−Vtn). At this time, the potential level of one input node of NAND circuit NAG1 also attains to the boosted potential Vpp in response to the increase of the potential level of node n11. The other input node of NAND circuit NAG1, that is, the input node connected to the output node of delay circuit DL, is kept at the potential level of "L". Therefore, the output level of NAND circuit NAG1 is at the "H" level (potential Vpp), and transistor TP13 is kept off.

At time T3 after the delay time TD from the time point T2, the output level of NAND circuit NAG1 attains to the "L" level (potential GND), and transistor TP13 is rendered conductive. In response, the signal BLI (i, 0) increases, and attains to the boosted potential Vpp at time T4.

The output level of driving circuit DR32 that is not in the selected state is kept at the "L" level.

In this configuration, what drives the potential of node n13 providing the signal BLI (i, 0) to the potential (Vpp−Vtn) is the N channel MOS transistor TN14, and further, P channel MOS transistor drives the potential of node n13 providing the signal BLI (i, 0) from the potential (Vpp−Vtn) to the boosted potential Vpp. Therefore, degradation in characteristic caused by "channel hot carriers" in this transistor can be suppressed.

[Fourth Embodiment]

Figure 15:
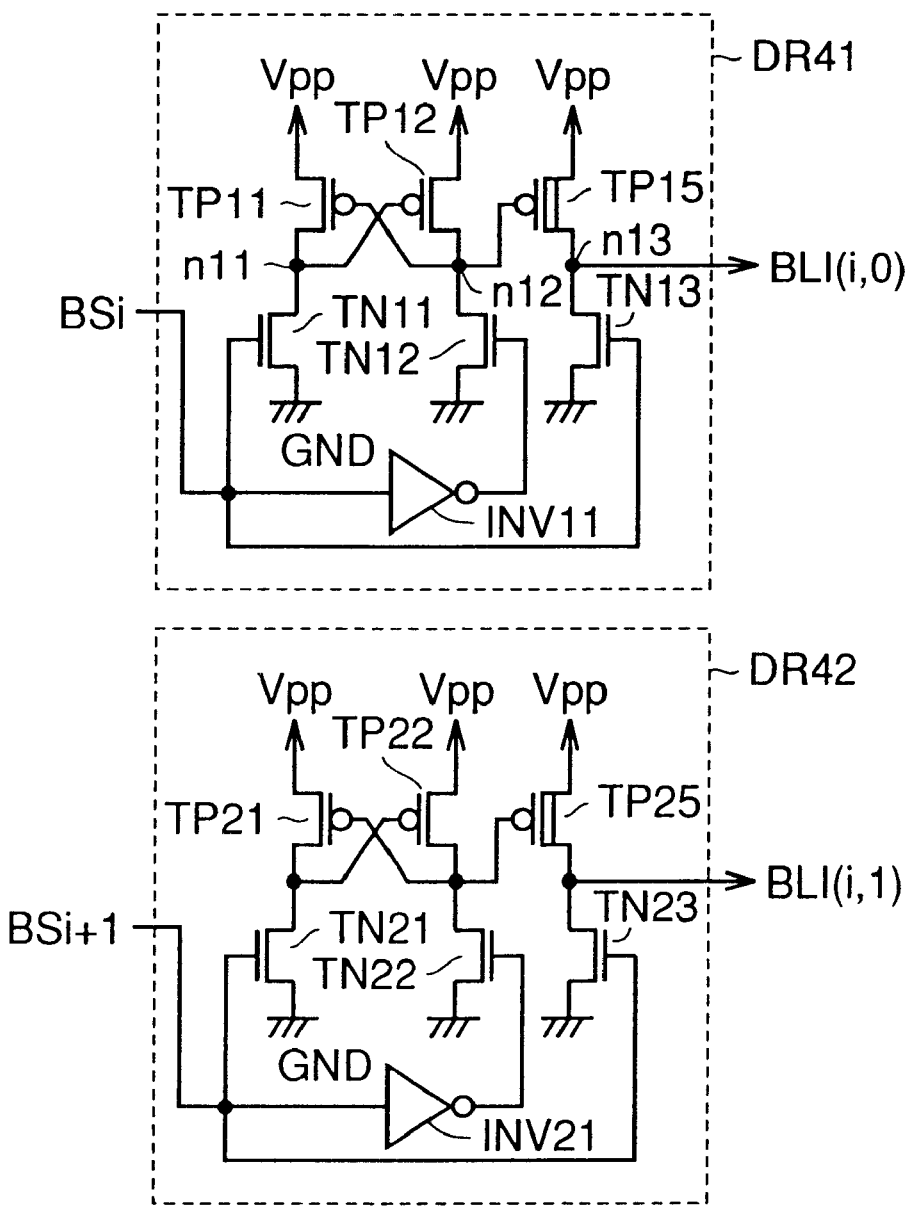
FIG. 15 is a schematic block diagram representing configurations of driving circuits DR41 and DR42.

FIG. 15 is a schematic block diagram representing the configurations of driving circuits DR41 and DR42 for generating the signals BLI (i, 0) and BLI (i, 1) (i: natural number) in accordance with the fourth embodiment of the present invention.

The configuration of driving circuit DR41 differs from that of driving circuit DR1 in accordance with the first embodiment shown in FIG. 9 in that a buried channel type P channel MOS transistor TP15 is provided between the boosted potential Vpp and the node n13 providing the signal BLI (i, 0). The transistor TP15 has its gate connected to node n12.

Therefore, in driving circuit DR41, the signal BLI (i, 0) is driven from the ground potential GND to the boosted potential Vpp by transistor TP13.

In driving circuit DR41, transistors TP11 and TP12 are surface channel type P channel MOS transistors, and, in order to provide the transistor TP15 which is a buried channel type P channel MOS transistor, an impurity is ion-implanted to attain a desired threshold voltage to the channel regions of respective transistors, the gate electrodes of transistors TP11 and TP12 are formed by p+-polysilicon, and the gate electrode of transistor TP15 is formed by n+-polysilicon.

Driving circuit DR22 basically has the same configuration as driving circuit DR21.

Figure 16:
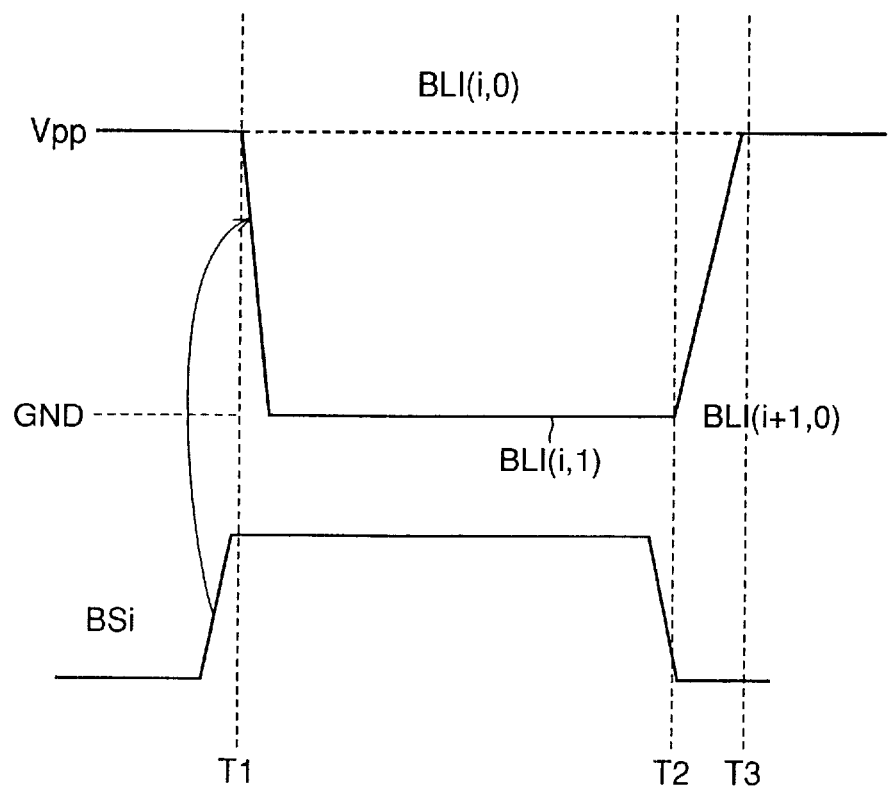
FIG. 16 is a timing chart representing the operations of the circuit shown in FIG. 15.

FIG. 16 is a timing chart representing the operation of the circuit shown in FIG. 15.

The operation is the same as that of driving circuit DR1 in accordance with the first embodiment shown in FIGS. 9 and 10 except that transistor TP15 is rendered conductive when the signal BSi is at the active state ("L" level), so that the signal BLI (i, 0) increases to the boosted potential Vpp, and therefore, description thereof is not repeated.

By the configuration shown in FIG. 15, it becomes possible to render gate transistors TG211, TG212 and the like sufficiently conductive to eliminate the influence of the voltage drop, without the necessity to boost the boosted level Vpp to such a high level as in the first embodiment.

Further, in order to increase the potential of node n13, buried P channel MOS transistor TP15 is used for driving, and therefore, degradation in reliability of P channel MOS transistor TP15 caused by the "channel hot carriers" can be suppressed.

[First Modification of the Fourth Embodiment]

In the fourth embodiment, transistor TP15 for driving the potential level of boosted node n13 in driving circuit DR41 and the like is a buried channel type MOS transistor.

In order to suppress degradation in reliability of transistor TP15 caused by the "channel hot carrier", it is possible to form transistor TP15 as a P channel MOS transistor having the so called LDD structure.

Figure 17:
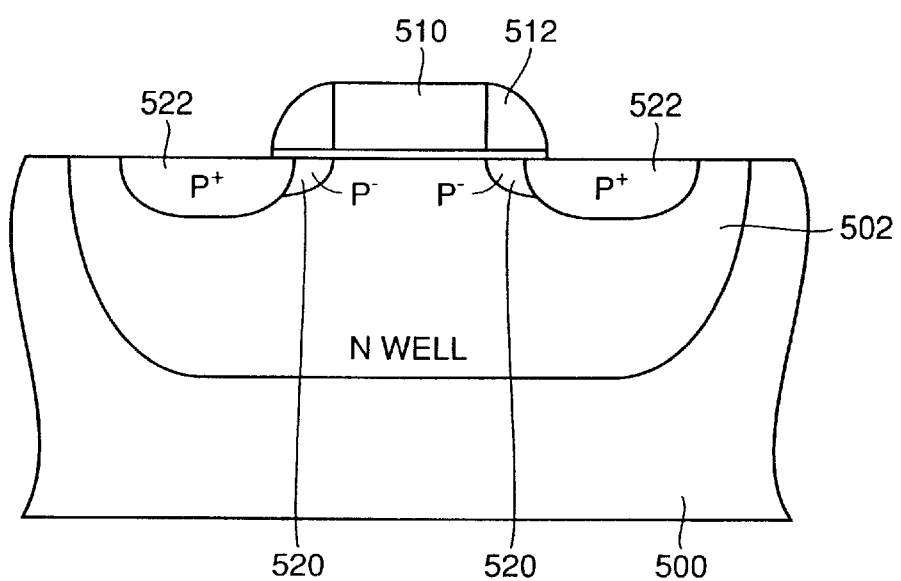
FIG. 17 shows a cross sectional structure of a LDD P channel MOS transistor corresponding to transistor TP15 of a first modification of a fourth embodiment.

FIG. 17 is a cross section showing the P channel MOS transistor having the LDD structure, corresponding to the transistor TP15 in accordance with the first modification of the fourth embodiment.

On an N well 502 formed at a main surface of p type Si substrate 500, a gate oxide film 504 is formed, and a gate electrode 510 is further formed, and processed to a prescribed shape.

Here, as described above, a thick oxide film (Tox=6 to 7.5 nm) is used as the gate oxide film 504 of transistor TP15 in accordance with the Dual-Tox method. It is assumed that gate electrode 510 is of p+-polysilicon. Therefore, transistor TP is a surface channel type MOS transistor.

On the surface side of N well 502 adjacent to gate electrode 510, p− regions 520, which are low concentration p type regions formed by ion implantation using gate electrode 510 itself as a mask, are provided. Further, on the surface side of N well 502, p+ regions 520, which are high concentration p type regions formed by ion implantation using sidewalls 512 of $SiO_2$ film as a mask, are provided.

As the ion implantation to form p− region 520, boron (B) or $BF_2$ is introduced, with the amount of implantation being up to about $10^{14}/cm^2$.

FIGS. 18 to 22 are cross sections showing the first to fifth steps of manufacturing P channel and N channel MOS transistors including such a transistor TP15.

Figure 18:
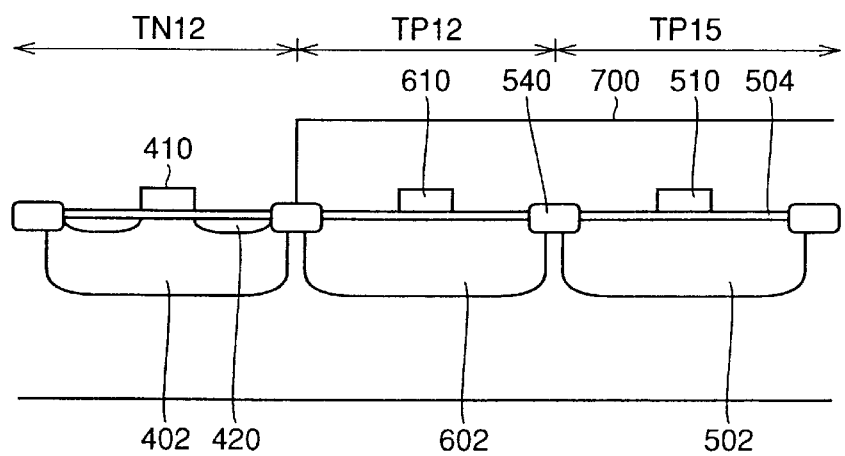
FIGS. 18 to 22 are cross sectional views showing the first to fifth steps of manufacturing a P channel MOS transistor and an N channel MOS transistor.

Referring to FIG. 18, on a main surface of the p type Si substrate 500, a P well 402 and N wells 502 and 602 are formed. Here, N well 502 is the well in which transistor TP15 is formed, for example, as described above. Further, it is assumed that transistor TP12 is formed in N well 602 and transistor TN12 is formed in P well 402, for example. The transistors are separated from each other by element isolating regions 540.

On N wells 502 and 602, gate electrodes 510 and 610 are formed by p+-polysilicon, respectively. On P well 402, a gate 410 is formed by n+-polysilicon.

First, using a photoresist 700 and gate 410 as masks, n− regions 420 are formed by phosphorus ion implantation.

Figure 19:
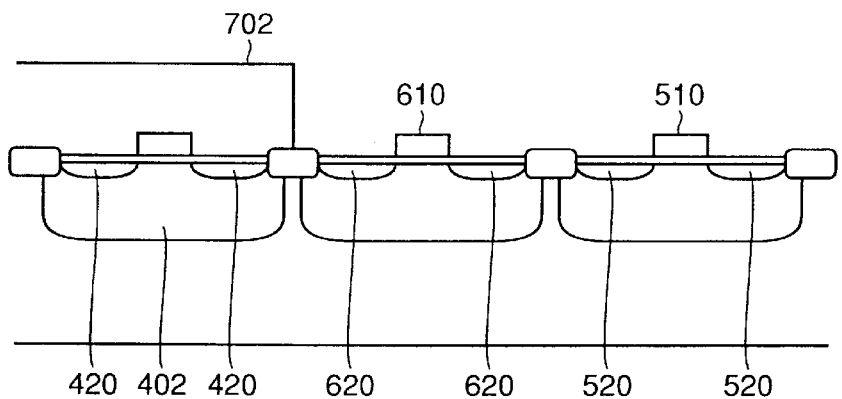

Thereafter, referring to FIG. 19, using a photoresist 702 and gate electrodes 510 and 610 as masks, $BF_2$ ions are implanted to form p− regions 520 and 620.

Figure 20:
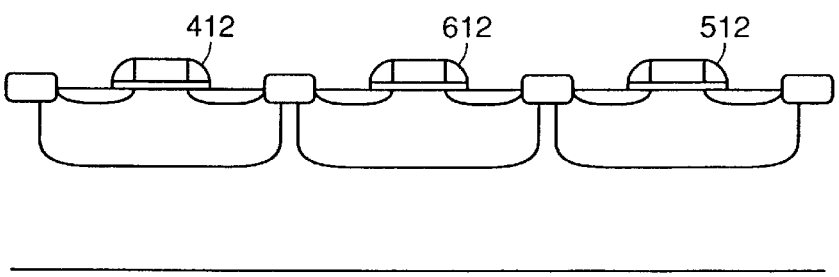

Referring to FIG. 20, by depositing an $SiO_2$ film by the CVD method, sidewalls 412, 512 and 612 are formed for gates 410, 510 and 610, respectively, by anisotropic etching.

Figure 21:
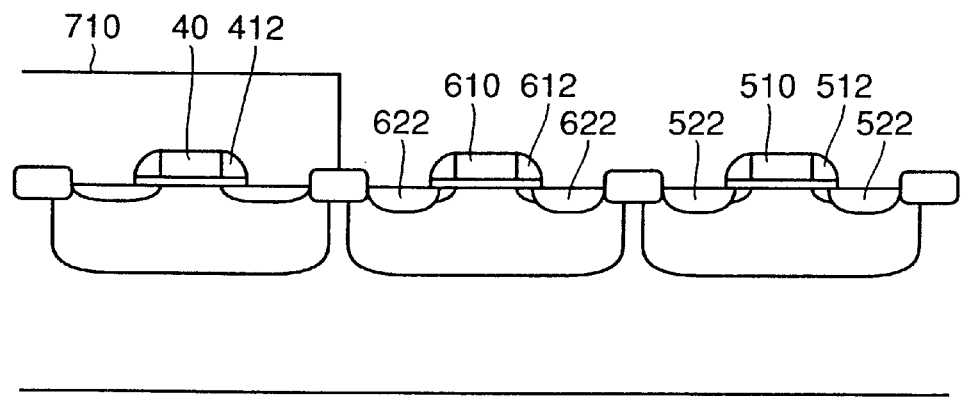

Referring to FIG. 21, using a photoresist mask 710, gate electrodes 510 and 610 as well as sidewalls 512 and 612 as masks, $BF_2$ ions are implanted to form p+ regions 522 and 622.

Figure 22:
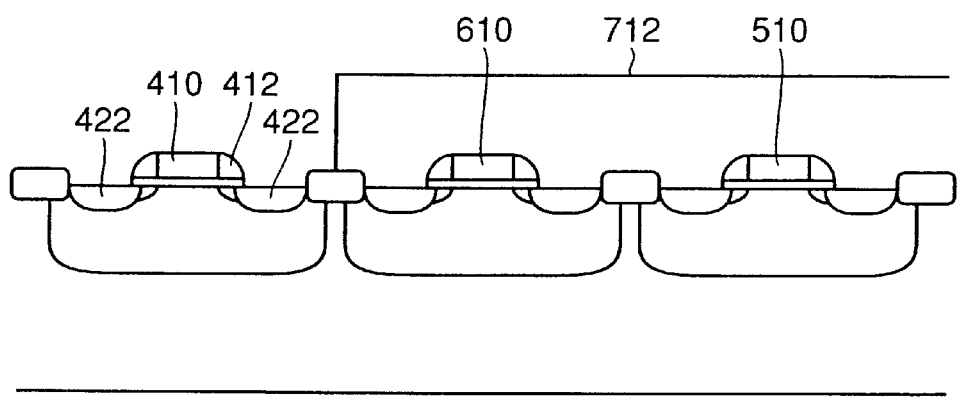

Referring to FIG. 22, using a photoresist mask 712, gate electrode 410 and sidewall 412 as mask, arsenic (As) ion is implanted to form n⁺ region 422.

In this manner, N channel and P channel MOS transistors are all formed with LDD structure, and therefore, it becomes possible to suppress degradation in reliability of transistor TP15 that boost node n13, caused by the "channel hot carriers."

[Second Modification of the Fourth Embodiment]

In the first modification of the fourth embodiment, P channel MOS transistors are all adapted to have the LDD structure.

It is noted, however, in the transistor TP15 or the like directly driving the boosted node n13, it is preferable to have relatively low impurity concentration of p⁻ region 520 of the LDD structure in order to sufficiently suppress degradation in reliability caused by "channel hot carriers", whereas in other P channel MOS transistors, preferably, the impurity concentration of p⁻ region 620 should be higher than that of p⁻ region 520, in view of transistor characteristics.

In the second modification of the fourth embodiment, the impurity concentration of the p⁻ region of transistor TP15 or the like driving the boosted node n13 is made lower than the concentration of the p⁻ region of other P channel MOS transistors.

More specifically, in order to form the p⁻ region 520 of transistor TP15 or the like, boron (B) or $BF_2$ is ion-implanted with the amount of up to about $10^{12}/cm^2$, and to form the p⁻ region 620 of other P channel MOS transistors including TP12, ion implantation amount is up to about $10^{14}/cm^2$.

FIGS. 23 to 28 are cross sections showing the first to sixth steps of manufacturing the P channel and N channel MOS transistors including transistor TP15.

Figure 23:
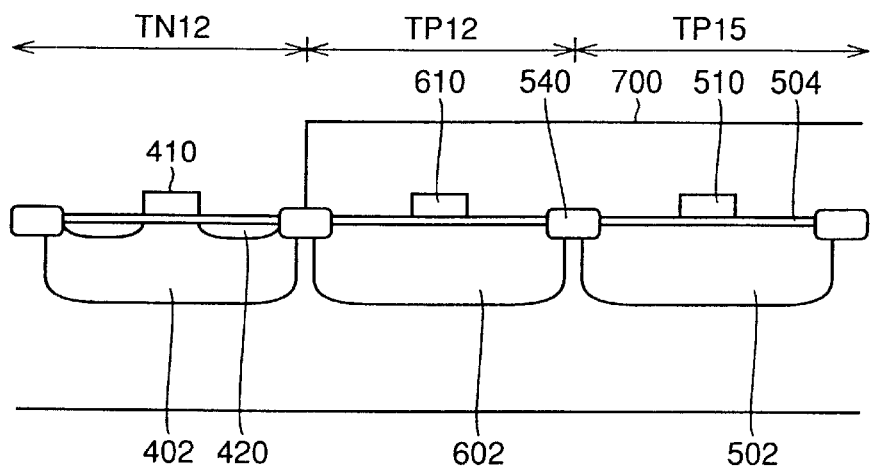
FIGS. 23 to 28 are cross sectional views showing the first to sixth steps of manufacturing a P channel MOS transistor and an N channel MOS transistor.
Figure 24:
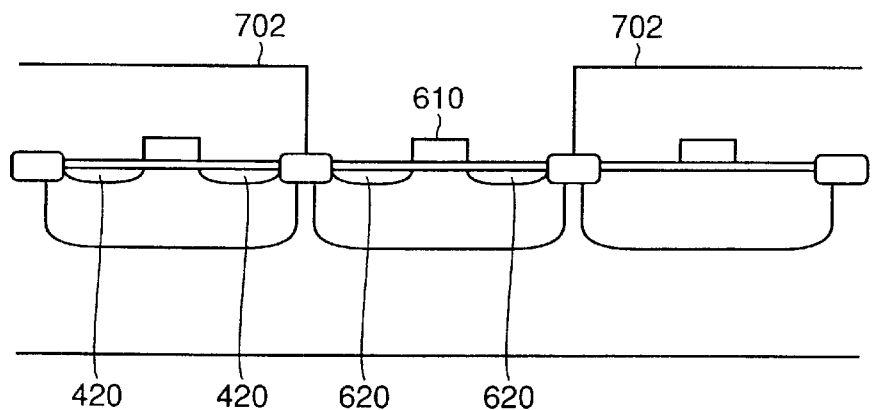
Figure 25:
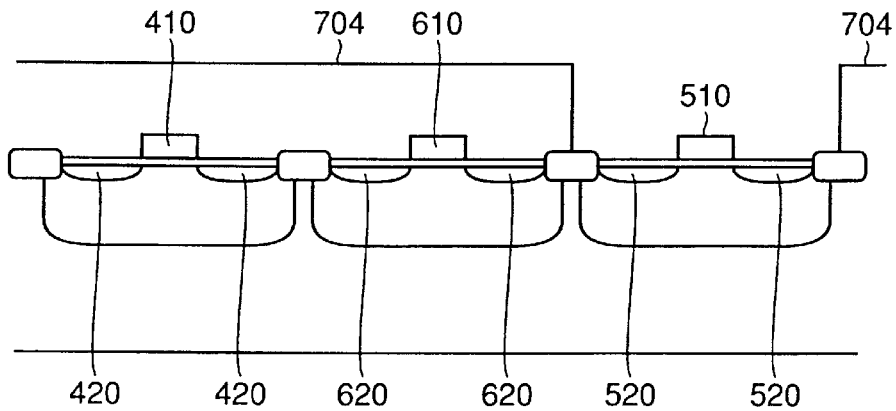

Different from the first modification of the fourth embodiment shown in FIGS. 18 to 22, referring to FIG. 23, the n⁻ region 420 is formed by phosphorus ion implantation using photoresist 700 and gate 410, and thereafter, the step of forming p⁻ regions 520 and 620 is divided into two steps, that is, the step of performing $BF_2$ ion implantation to form p⁻ region 620 using photoresist 702 and gate electrode 610 as mask as shown in FIG. 24, and the step of performing $BF_2$ ion implantation to form p⁻ region 520 using photoresist 704 and gate electrode 510 as mask, as shown in FIG. 25.

Figure 26:
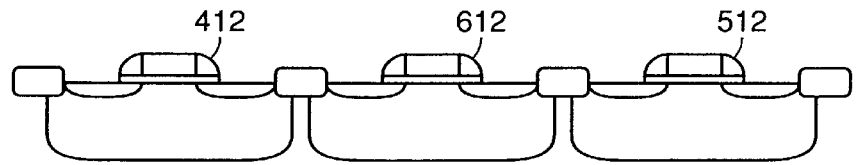
Figure 27:
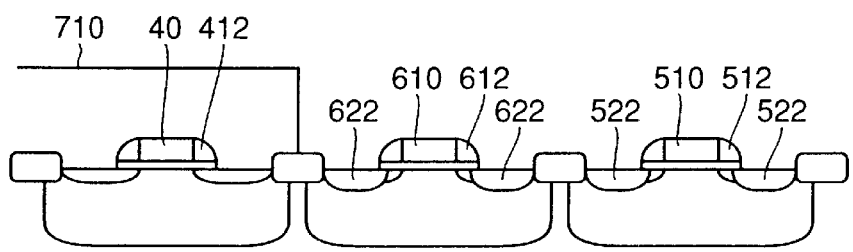
Figure 28:
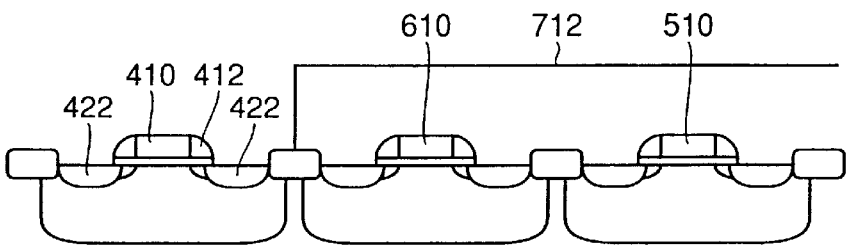

The following steps shown in FIGS. 26 to 28 are the same as the step shown in FIGS. 20 to 22. Therefore, corresponding portions are denoted by the same reference characters, and description thereof will not be repeated.

By the above described structure also, it is possible to suppress degradation in reliability of transistor TP15 boosting node n13 caused by "channel hot carriers."

Referring to FIG. 24, it is possible to form transistor TP15 or the like for boosting node n13 only to have the LDD structure, by sufficiently increasing concentration of ion implantation using photoresist 702 and gate electrode 610 as masks, to be comparable to the concentration of p⁺ region 522.

[Fifth Embodiment]

Figure 29:
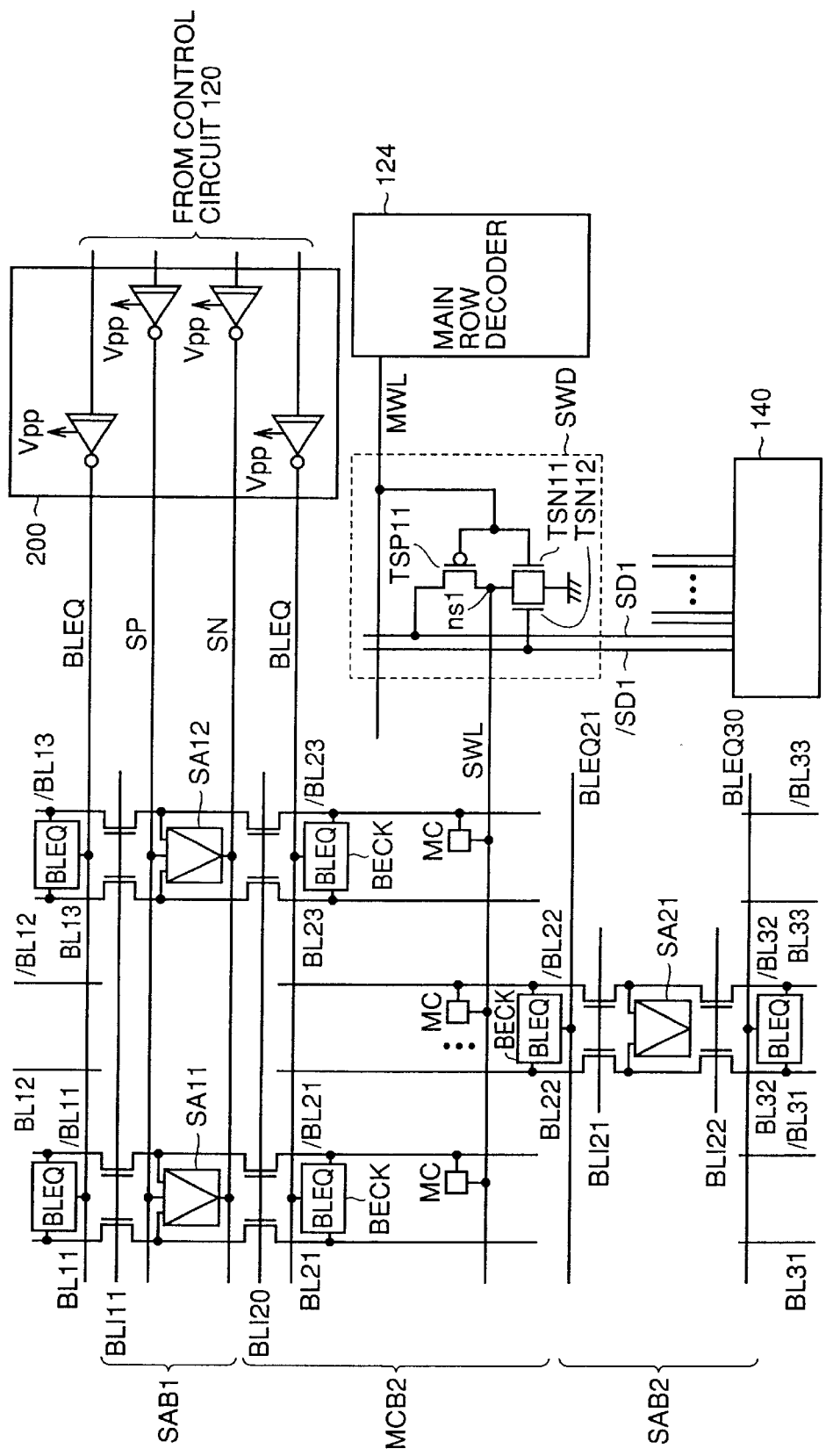
FIG. 29 is a schematic block diagram representing a configuration for selecting a subword line and a configuration for equalizing bit line potentials.

FIG. 29 is a schematic block diagram representing a configuration for selecting a sub word line in the memory cell block MCB2 and sense amplifier bands SAB1 and SAB2, and a configuration for equalizing the bit line potentials, shown in FIG. 8.

In FIG. 29 also, the bit line pairs BL21, /BL21, BL22, /BL22 and BL23, /BL23 of memory cell block MCB2 are extracted and shown as representatives.

A bit line equalizing circuit BECK is provided for each of the bit line pairs BL21 and /BL21, BL22 and /BL22 and BL23 and /BL23. The bit line equalizing circuit BECK is activated by a bit line equalizing signal BLEQ. The bit line equalizing signal BLEQ is generated by a control signal generating circuit 200 outputting an internal control signal under the control of control circuit 120. Control signal generating circuit 200 also generates driving signals SN and SP for sense amplifiers SA11, SA12, SA21 and the like.

Control signal generating circuit 200 includes inverters 202 and 204 outputting the bit line equalizing signals BLEQ, and inverters 212 and 214 generating driving signals SN and SP. The P channel MOS transistors constituting inverters 202, 204, 212 and 214 are buried channel type P channel MOS transistors, as in the fourth embodiment.

Further, memory cells MC respectively connected to bit line pairs BL21 and /BL21, BL22 and /BL22 are selected by a subword line SWL. The subword line SWL is set to an active potential (potential Vpp) by a subword driver SWD that operates in response to the potential of a main word line MWL selected by a main row decoder 124 and the potentials of subdecoder lines SD1, /SD1 to SD4, /SD4 driven by a subdecode signal generating circuit (hereinafter referred to as SD signal generating circuit) 140.

In FIG. 29, among the plurality of subword drivers, the subword driver SWD driven by subdecode lines SD1, /SD1 is extracted as an example.

Subword driver SWD includes a P channel MOS transistor TSP11 and an N channel MOS transistor TSN11 connected in series between subdecode line SB1 the ground potential GND, and an N channel MOS transistor TSN12 provided between the ground potential GND and a connection node ns1 between transistors TSP11 and TSN11.

Transistors TSP11 and TSN11 have their gates coupled to main word line MWL, and transistor TSN12 has its gate connected to subdecode line /SD1.

Figure 30:
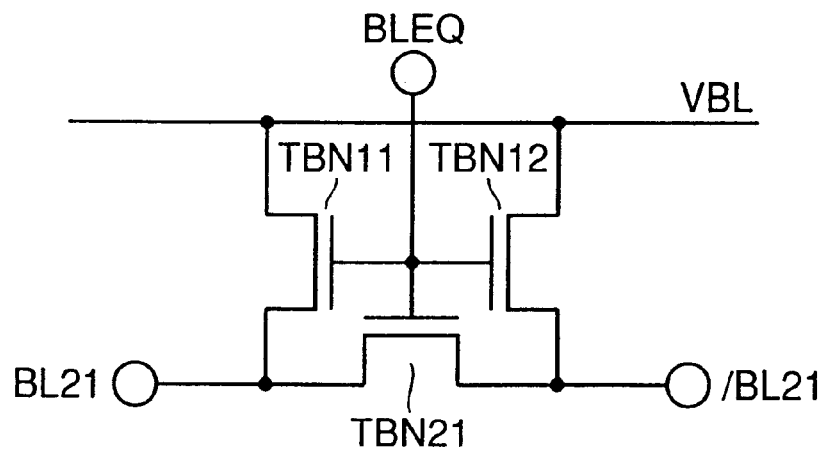
FIG. 30 is a circuit diagram representing a configuration of a bit line equalize circuit BECK.

FIG. 30 is a schematic diagram representing the configuration of the bit line equalizing circuit BECK shown in FIG. 29.

Bit line equalizing circuit BECK includes: an N channel MOS transistor TBN11 provided between bit line equalizing potential VBL and bit line BL1; an N channel MOS transistor TBN12 provided between bit line equalizing potential VBL and bit line /BL21; and an N channel MOS transistor TBN21 provided between bit lines BL21 and /BL21. The bit line equalizing potential VBL is, when the "H" level supplied to the memory cell is int.Vcc, int.Vcc/2. The gates of transistors TBN11, TBN21 and TBN21 receive the bit line equalizing signal BLEQ.

Figure 31:
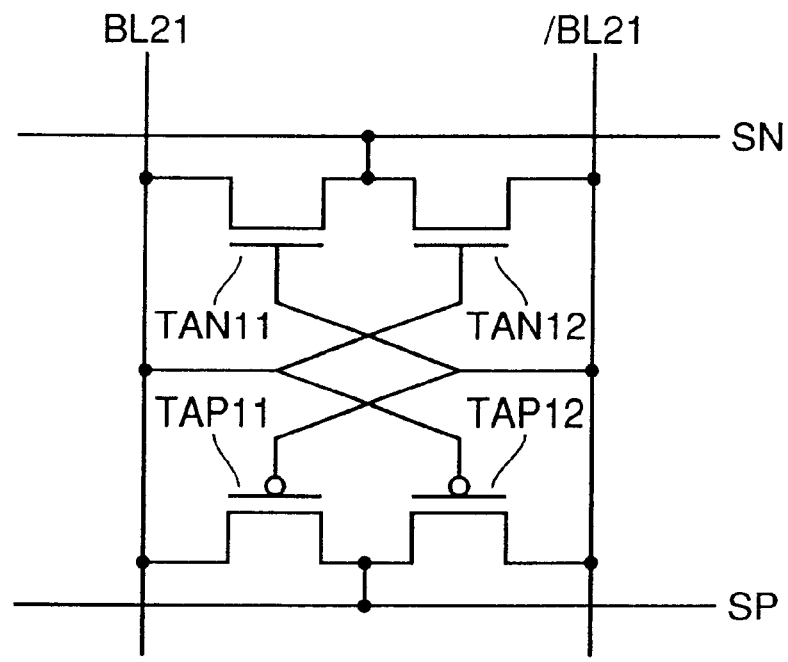
FIG. 31 is a circuit diagram representing a configuration of a sense amplifier SA11 shown in FIG. 29.

FIG. 31 is a schematic diagram representing the configuration of sense amplifier SA11 shown in FIG. 29.

Sense amplifier SA includes an N channel MOS transistor TAN11 provided between an SN signal line transmitting the driving signal SN and bit line BL21; a P channel MOS transistor TAP11 provided between an SP signal line transmitting a driving signal SP and bit line BL21; an N channel MOS transistor TAN12 provided between the SN signal line and the bit line /BL21; and a P channel MOS transistor TAP12 provided between the SP signal line and the bit line /BL21. The gates of transistors TAN11 and TAP11 are coupled to bit line /BL21, while the gates of transistors TAN12 and TAB12 are coupled to bit line BL21.

Figure 32:
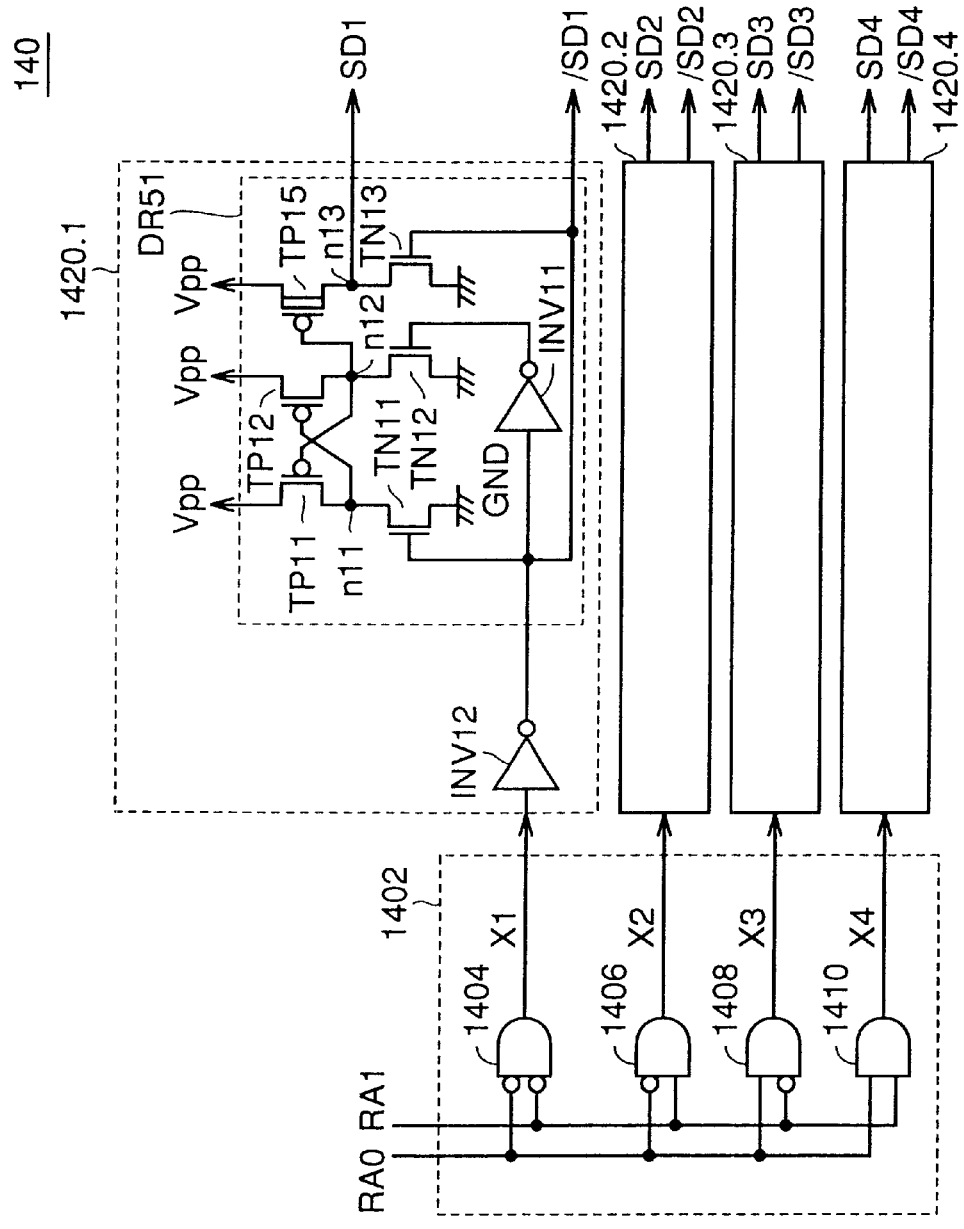
FIG. 32 is a schematic block diagram representing a configuration of an SD signal generating circuit 140 shown in FIG. 29.

FIG. 32 is a schematic block diagram representing the configuration of the SD signal generating circuit 140 shown in FIG. 29.

Referring to FIG. 32, SD signal generating circuit 140 includes a decode circuit 1402 receiving row predecode signals RA0 and RA1 and generating signals X1 to X4, and signal converting circuits 1420.1 to 1420.4 for providing signals SD1 and /SD1 to SD4 and /SD4, in response to the signals X1 to X4, respectively.

Decode circuit 1402 includes: a logic gate 1404 responsive to activation of an inverted signal of signal RA0 and activation of an inverted signal of signal RA1 for setting the signal X1 to the active state ("H" level); a logic gate 1406 responsive to activation of an inverted signal of the signal RA0 and activation of the signal RA1 for setting the signal X2 to the active state; a logic gate 1408 responsive to activation of the signal RA0 and activation of an inverted signal of signal RA1 for setting the signal X3 to the active state; and a logic gate 1410 responsive to activation of signals RA0 and RA1 for setting the signal X4 to the active state.

Signal converting circuit 1420.1 includes an inverter INV12 inverting the signal X1, and a driving circuit DR51. Basic configuration of driving circuit DR51 is the same as the driving circuit DR41 in accordance with the fourth embodiment described with reference to FIG. 15. It should be noted, however, that the signal SD1 is output from node n13, and the output of inverter INV12 is provided as the signal /SD1. Except for these points, driving circuit DR51 has the same structure as driving circuit DR41, and therefore, corresponding portions are denoted by the same reference characters and description thereof is not repeated.

Therefore, transistor TP15 is a buried channel type P channel MOS transistor.

Signal converting circuits 1420.2 to 1420.4 basically have the same configuration as signal converting circuit 1420.1.

When the signal X1 is at the "H" level, for example, the output of inverter INV12 is "L" and the output of inverter INV11 is "H". In response, transistor TN12 is rendered conductive, setting the gate potential of transistor TP15 to the ground potential GND. Transistor TP15 is rendered conductive, and sets the level of node n13, that is, the level of the signal SD1 to the potential Vpp.

Again referring to FIG. 29, the potential of a main word line MWL in the selected state is at the ground potential GND, transistor TSP11 is conductive, and transistor TSN11 is off. As the level of signal SD1 attains to the potential Vpp, the potential level of sub word line SWL also attains to the potential Vpp.

In the above described structure, when the potential of node n13 is to be increased to set the subword line to the selected state, buried channel type P channel MOS transistor TP15 is used for driving, and therefore, it is possible to suppress degradation in reliability of P channel MOS transistor TP15 caused by "channel hot carriers." Further, in generating the bit line equalizing signal BLEQ and sense amplifier driving signals SN and SP, it is also possible to suppress degradation in reliability caused by "channel hot carriers."

Though transistor TP15 has been described as a buried channel type P channel MOS transistor above, the transistor TP15 may be an LDD type P channel MOS transistor as in the first and second modifications of the fourth embodiment.

[First Modification of the Fifth Embodiment]

Figure 33:
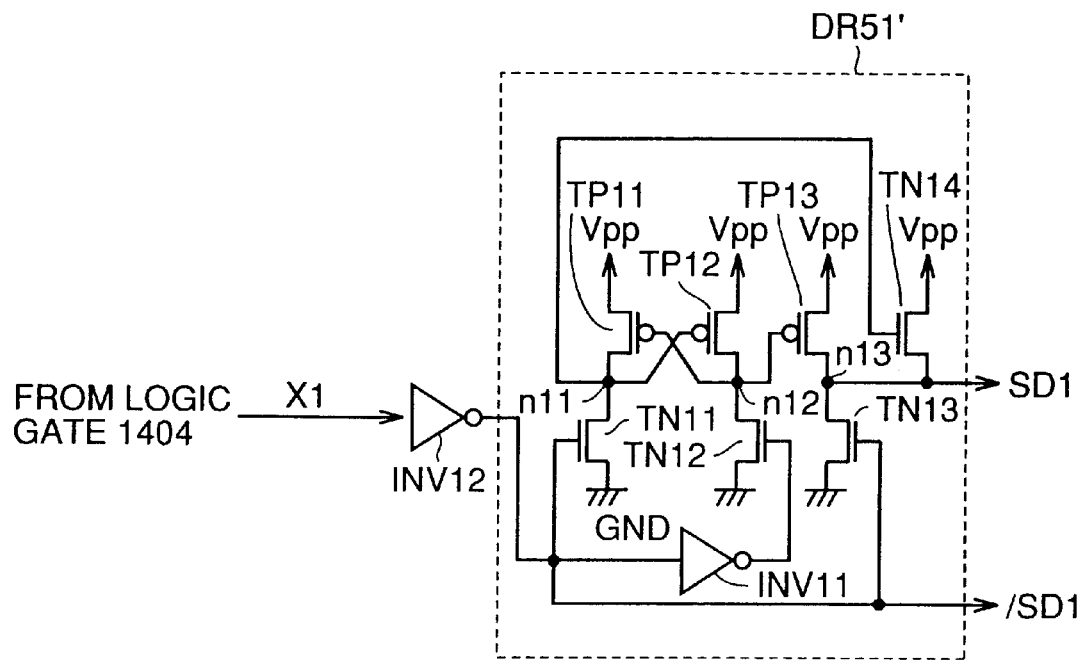
FIG. 33 is a circuit diagram representing a configuration of a driving circuit DR51 in signal converting circuits 1420.1 to 142.4 in accordance with a first modification of a fifth embodiment.

FIG. 33 is a schematic diagram representing the configuration of a driving circuit DR51' in the signal converting circuits 1420.1 to 1420.4 in accordance with the first modification of the fifth embodiment.

The basic configuration of the driving circuit DR51' is the same as that of the driving circuit DR21 described with reference to FIG. 11. It should be noted, however, that the signal SD1 is output from node n13, and the output of inverter INV12 is provided as the signal /SD1. Except for these points, the driving circuit DR51' has the same structure as driving circuit DR21, and therefore, corresponding portions are denoted by the same reference characters and description thereof will not be repeated.

In this configuration also, when the potential of node n13 is to be increased, both N channel MOS transistor TN14 and P channel MOS transistor TP13 are used for driving.

Therefore, it is possible to suppress degradation in reliability of P channel MOS transistor TP13 caused by "channel hot carriers."

As the configuration of driving circuit DR51, the configuration of driving circuit DR1 in accordance with the first embodiment or the configuration of DR31 in accordance with the third embodiment may be used.

[Second Modification of the Fifth Embodiment]

Figure 34:
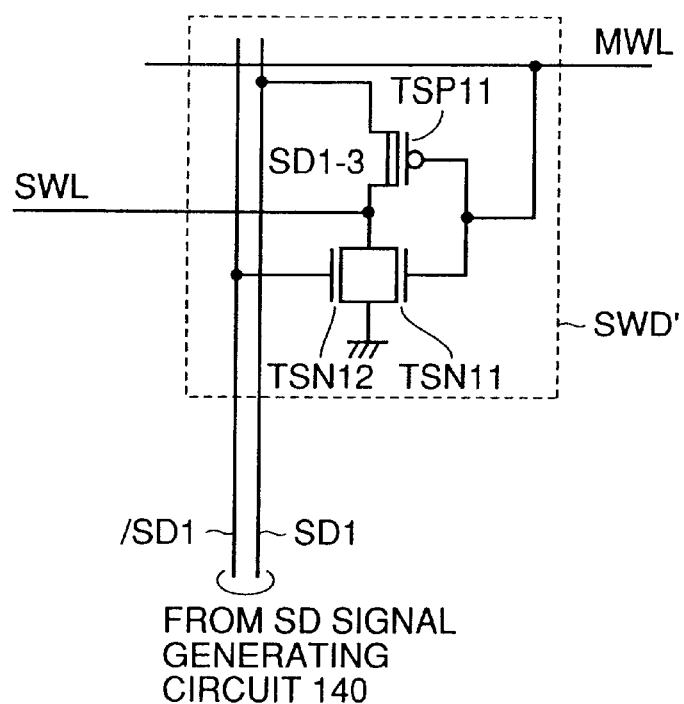
FIG. 34 is a circuit diagram representing a configuration of a subword driver SWD' of a second modification of the fifth embodiment.

FIG. 34 is a schematic diagram representing the configuration of a subword driver SWD' in accordance with a second modification of the fifth embodiment.

In subword driver SWD', the transistor TSP11 in the configuration of subword driver SWD described with reference to FIG. 29 is a buried channel type P channel MOS transistor. Except for this point, subword driver SWD' has the same structure as subword driver SWD. Therefore, corresponding portions are denoted by the same reference characters and description thereof will not be repeated.

In this configuration, when the potential of subword line SWL is to be increased, the potential is driven by the buried channel type P channel MOS transistor TSP11, and therefore degradation in reliability of transistor TSP11 caused by the "channel hot carriers" can be suppressed.

Though transistor TSP11 has been described as a buried channel type P channel MOS transistor in the foregoing, transistor TSP11 may be an LDD type P channel MOS transistor as in the first and second modifications of the fourth embodiment.

[Sixth Embodiment]

Figure 35:
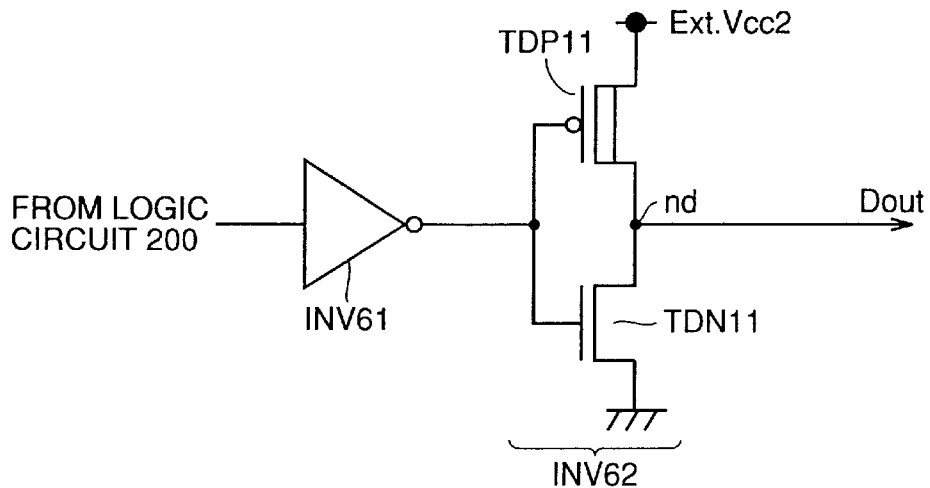
FIG. 35 is a circuit diagram representing a configuration of a data output buffer BOB in a data I/O circuit portion 300 shown in FIG. 1.

FIG. 35 is a schematic diagram representing a configuration of a data output buffer DOB in the data I/O circuit portion 300 shown in FIG. 1.

Referring to FIG. 35, data output buffer DOB includes an inverter INV61 receiving a signal from a logic circuit 200, and an inverter INV62 receiving an output from inverter INV61 and providing an output signal Dout.

Inverter INV62 includes a buried channel type P channel MOS transistor TDP11 and an N channel MOS transistor TDN11 provided in series between an external power supply potential Ext.Vcc2 and the ground potential GND. The signal Dout is provided from a connection node nd between transistors TDP11 and TDN11.

In this configuration, when the potential of connection node nd is to be increased, the potential is driven by the buried channel type P channel MOS transistor TDP11. Therefore, it is possible to suppress degradation in reliability of transistor TDP11 caused by "channel hot carriers."

Though transistor TDP11 has been described as a buried channel type P channel MOS transistor in the foregoing, transistor TDP11 may be an LDD type P channel MOS transistor as in the first and second modifications of the fourth embodiment.

[Seventh Embodiment]

Figure 36:
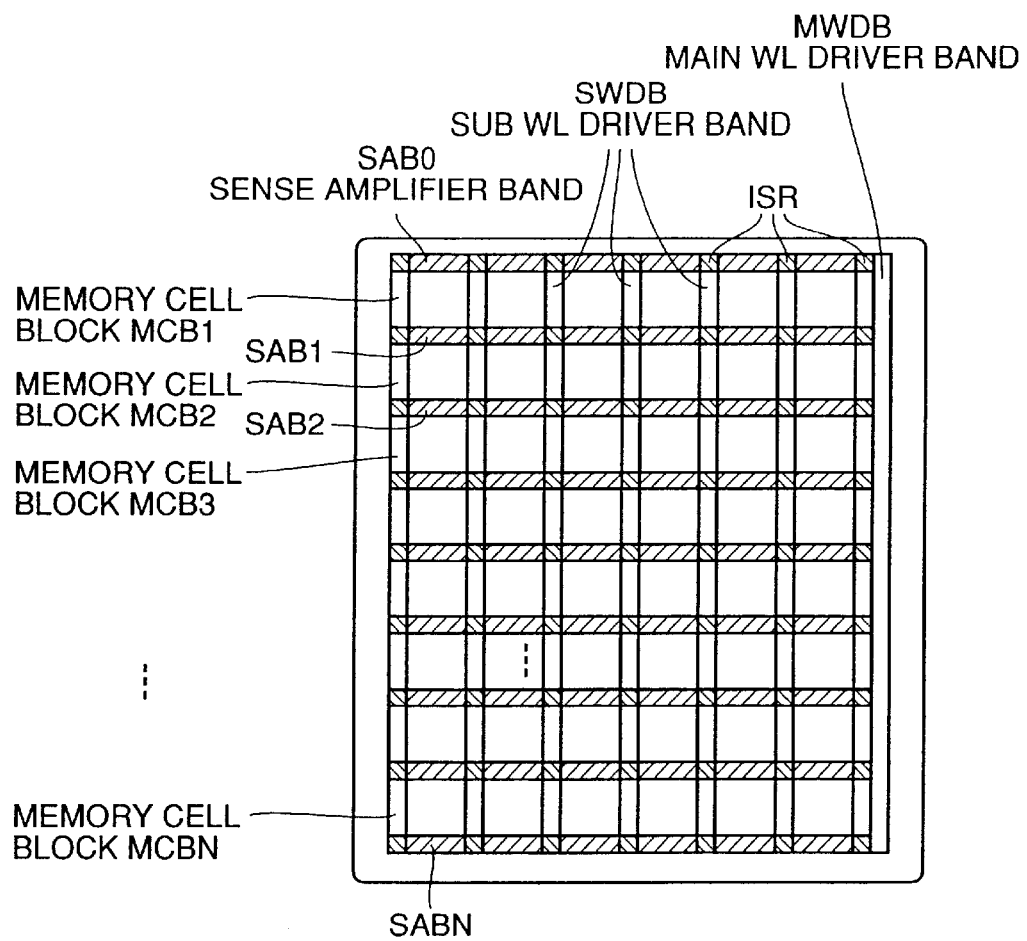
FIG. 36 is a schematic diagram representing another exemplary configuration of memory cell array 102 shown in FIG. 1.

FIG. 36 is a schematic diagram representing another exemplary configuration of memory cell array 102 shown in FIG. 1.

Referring to FIG. 36, the memory cell array is divided into N memory cell blocks MCB1 to MCBN in the column direction, and sense amplifier bands SAB0 to SABN are shared by adjacent memory cell blocks. For example, a plurality of bit line pairs in memory cell block MCB2 are arranged to be coupled to sense amplifiers in sense amplifier band SAB1 or sense amplifiers in sense amplifier band SAB2, alternately.

At every prescribed memory cell column, a subword driver band SWDB is provided along the row direction. The subword driver SWD in the subword driver band SWDB is driven by a main word line MWL (not shown) from the main word driver band MWDB.

In the following, regions where subword driver band SWDB intersects sense amplifier bands SAB0 to SABN will be referred to as "intersecting regions ISR". In the intersecting region ISR, in principle, neither the sense amplifier nor the subword driver is arranged.

Figure 37:
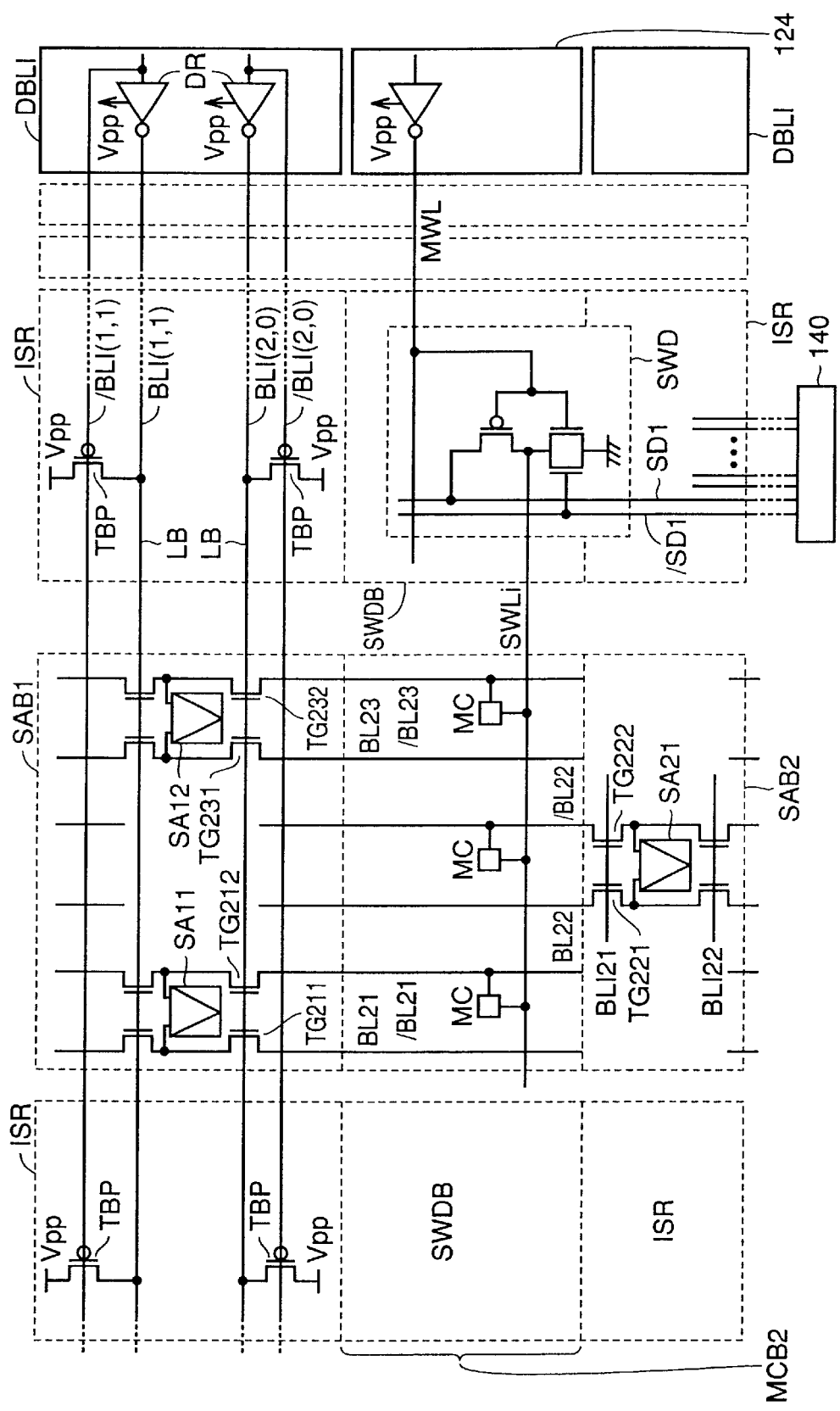
FIG. 37 is a circuit diagram showing extracted configurations of memory cell block MCB2 and sense amplifier bands SAB1 and SAB2 shown in FIG. 36.
Figure 38:
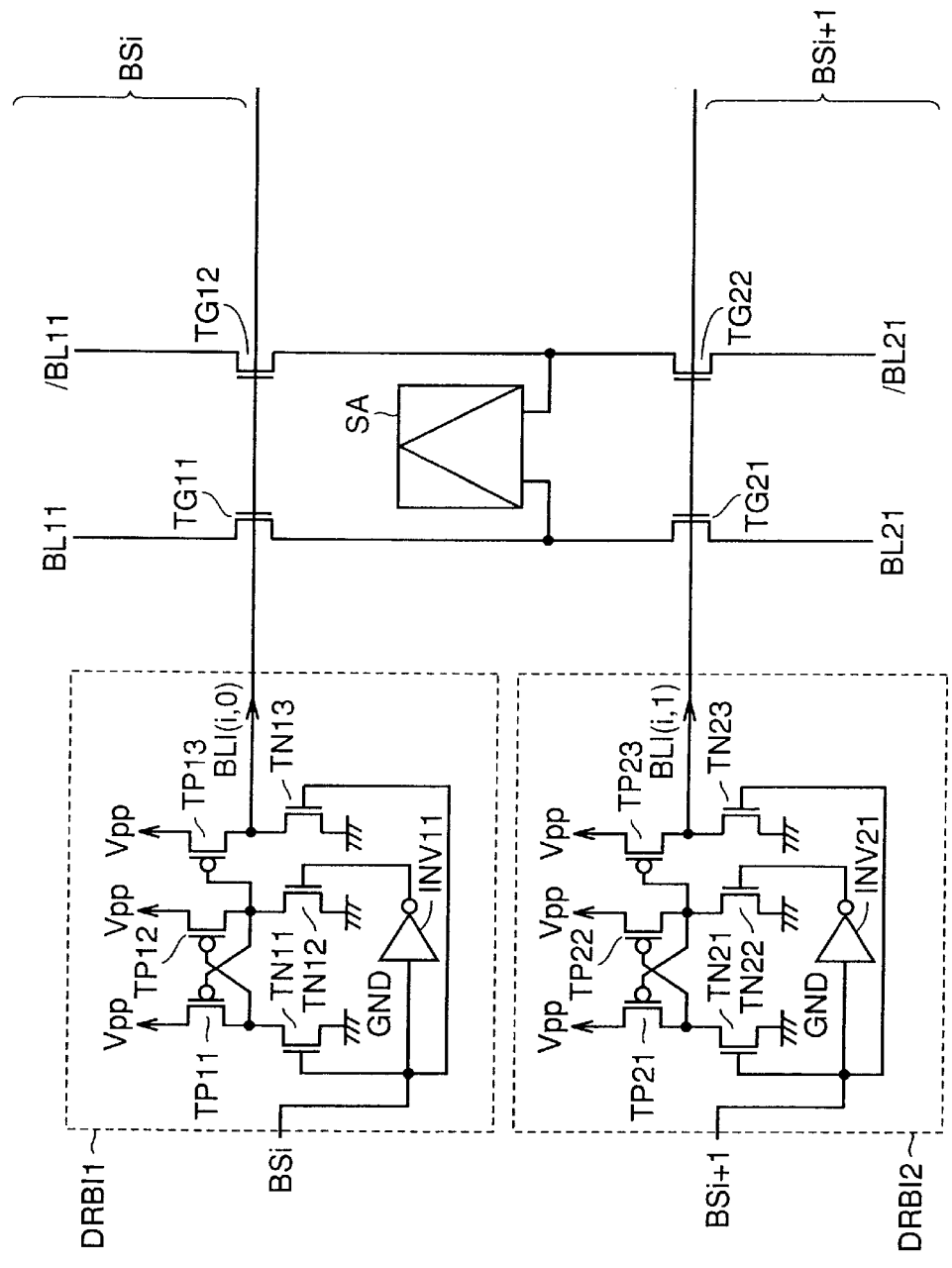
FIG. 38 is a schematic block diagram illustrating the configurations of driving circuits DRBI1 and DRBI2 for generating a signal BLI.
Figure 39:
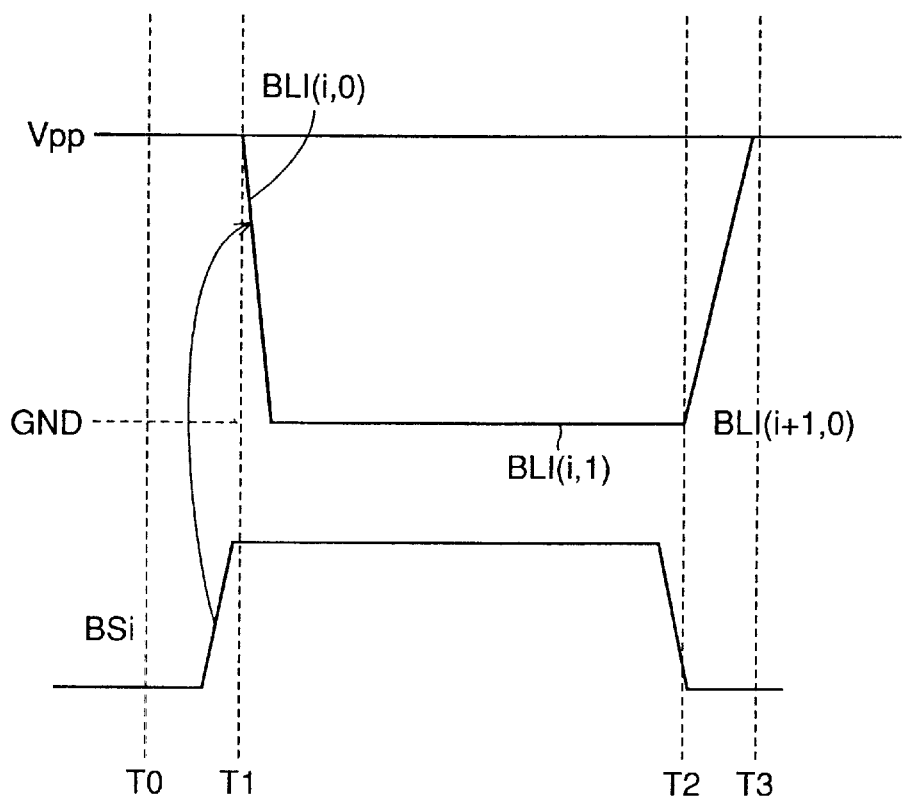
FIG. 39 is a timing chart illustrating the operation of the circuit shown in FIG. 38.

FIG. 37 is a schematic diagram extracting and showing the configurations of memory cell block MCB2 and sense amplifier bands SAB1 and SAB2 shown in FIG. 36.

Referring to FIG. 37, the pair of bit lines BL21 and /BL21 can be electrically coupled to sense amplifier SA11 in sense amplifier band SAB1 through N channel MOS transistors TG211 and TG212, respectively. The pair of bit lines BL22 and /BL22 next to the pair of bit lines BL21 and /BL21 can be electrically coupled to sense amplifier SA21 in sense amplifier band SAB2 through N channel MOS transistors TG221 and TG222, respectively. Further, the pair of bit lines BL23 and /BL23 next to the pair of bit lines BL22 and /BL22 can be electrically coupled to sense amplifier SA12 in sense amplifier band SAB1 through N channel MOS transistors TG232 and TG232, respectively.

The gate potentials of transistors TG211 and TG212, TG221 and TG222 as well as TG231 and TH232 are driven by the signal BLI (2, 0).

BLI signal driving circuit DBLI provides not only the signal BLI (2, 0) but also an inverted signal thereof, that is, /BLI (2, 0). The circuit DR in BLI signal driving circuit DBLI may have a similar configuration as the driving circuit DR1 described with reference to the first embodiment. Alternatively, the driving circuit DR may have the configuration described with reference to FIGS. 11, 13 or 15.

Further, the potential level of the line LB transmitting the signal BLI (2, 0) is driven not only by the driving circuit DR but also by the P channel MOS transistor TBP provided at every intersecting region ISR. Here, transistor TBP is provided between the boosted potential Vpp and the line LB, and the gate potential thereof is driven by the signal /BLI (2, 0).

In this configuration, when the potential of the line LB is to be increased, both the N channel MOS transistor TN13 (not shown) in the driving circuit DR and surface channel type P channel MOS transistor TBP are used for driving. Therefore, degradation in reliability caused by "channel hot carriers" can be suppressed. Further, the transistor TBP is provided at every intersecting region, the time for driving the potential of the line LB can be made shorter.

Further, the P channel MOS transistor TBP may be a buried channel type P channel MOS transistor. Alternatively, P channel MOS transistor TBP may be an LDD type P channel MOS transistor as in the first and second modifications of the fourth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a logic circuit portion operating at a ground potential and a first power supply potential;

a voltage down converting circuit for generating, from an external power supply potential, a second internal power supply potential by down-converting the external power supply potential;

a boosting circuit for generating, a boosted potential; and a memory portion operating with at least said ground potential, said second internal power supply potential and said boosted potential, for transmitting/receiving data to and from said logic circuit portion, said memory portion including a plurality of memory cells arranged in a matrix of rows and columns, each capable of storing either one of at least two levels corresponding to said ground potential and second internal power supply potential, and a driving circuit operating upon reception of said boosted potential, and generating, at least in a data reading operation from said memory cells, an internal control signal having a level corresponding to said boosted potential, for controlling said reading operation; wherein said driving circuit has an output node for outputting said internal control signal, and a surface channel type N channel MOS transistor provided between said output node and said boosted potential, for pulling up a potential level of said output node.

2. The semiconductor integrated circuit device according to claim 1, wherein said driving circuit further has a surface channel type P channel MOS transistor provided between said output node and said boosted potential, for pulling up potential level of said output node.

3. The semiconductor integrated circuit device according to claim 2, wherein said driving circuit further has a timing control circuit for rendering conductive said surface channel type P channel MOS transistor after a prescribed time period from said surface channel type N channel MOS transistor is rendered conductive.

4. The semiconductor integrated circuit device according to claim 1, wherein said memory portion further includes a plurality of word lines provided corresponding to rows of said memory cells, and a word driver circuit for selectively activating potential level of said word lines; and said driving circuit supplies said internal control signal as an activating level of said word lines, to said word driver circuit.

5. The semiconductor integrated circuit device according to claim 1, wherein said plurality of memory cells are arranged divided into a plurality of memory cell blocks;

said memory portion further includes a sense amplifier portion commonly provided corresponding to a prescribed number of memory cell blocks in said plurality of memory cell blocks, for amplifying data read from said memory cells of a selected memory cell block, and a gate circuit for selectively coupling said sense amplifier portion and the corresponding memory cell block; and said gate circuit has a plurality of N channel MOS transistors controlled by said internal control signal, for opening/closing coupling between said memory cell blocks and said sense amplifier portion.

6. The semiconductor integrated circuit device according to claim 1, further comprising a data input/output unit operating upon reception of said external power supply potential and said ground potential, for transmitting/receiving data to and from said logic circuit portion and the outside of said semiconductor integrated circuit device; wherein said data input/output portion includes a buried channel type P channel MOS pull up transistor and an N channel MOS pull down transistor connected in series between said external power supply potential and said ground potential.

7. The semiconductor integrated circuit device according to claim 1, further comprising a data input/output portion operating upon reception of said external power supply potential and said ground potential, for transmitting/receiving data between said logic portion and the outside of said semiconductor integrated circuit device; wherein said data input/output portion includes an LDD type P channel MOS pull up transistor and an N channel MOS pull down transistor connected in series between said external power supply potential and said ground potential.

8. A semiconductor integrated circuit device, comprising:

a logic circuit portion operating at a ground potential and a first power supply potential;

a voltage down converting circuit for generating, from an external power supply potential, a second internal power supply potential by down-converting the external power supply potential;

a boosting circuit for generating a boosted potential; and a memory portion operating with at least said ground potential, said second internal power supply potential and said boosted potential, for transmitting/receiving data to and from said logic circuit portion, said memory portion including a plurality of memory cells arranged in a matrix of rows and columns, each capable of storing either one of at least two levels corresponding to said ground potential and second internal power supply potential, and a driving circuit operating upon reception of said boosted potential, and generating, at least in a data reading operation from said memory cells, an internal control signal having a level corresponding to said boosted potential, for controlling said reading operation; wherein said driving circuit has an output node for outputting said internal control signal, and a buried channel type P channel MOS transistor provided between said output node and said boosted potential, for pulling up a potential level of said output node.

9. The semiconductor integrated circuit device according to claim 8, wherein said memory portion further includes a plurality of word lines provided corresponding to rows of said memory cells, and a word driver circuit for selectively activating potential level of said word lines; wherein said driving circuit supplies said internal control signal as an active level of an output signal of said word line driver circuit.

10. The semiconductor integrated circuit device according to claim 8, wherein said plurality of memory cells are arranged divided into a plurality of memory cell blocks;

said memory portion further includes a sense amplifier portion commonly provided corresponding to a prescribed number of memory cell blocks in said plurality of memory cell blocks, for amplifying data read from said memory cells of a selected memory cell block, and a gate circuit for selectively coupling said sense amplifier portion and the corresponding memory cell block; and said gate circuit has a plurality of N channel MOS transistors controlled by said internal control signal, for opening/closing coupling between said memory cell blocks and said sense amplifier portion.

11. The semiconductor integrated circuit device according to claim 8, further comprising a data input/output unit operating upon reception of said external power supply potential and said ground potential, for transmitting/receiving data to and from said logic circuit portion and the outside of said semiconductor integrated circuit device; wherein said data input/output portion includes a buried channel type P channel MOS pull up transistor and an N channel MOS pull down transistor connected in series between said external power supply potential and said ground potential.

12. The semiconductor integrated circuit device according to claim 8, further comprising a data input/output portion operating upon reception of said external power supply potential and said ground potential, for transmitting/receiving data between said logic portion and the outside of said semiconductor integrated circuit device; wherein said data input/output portion includes an LDD type P channel MOS pull up transistor and an N channel MOS pull down transistor connected in series between said external power supply potential and said ground potential.

13. A semiconductor integrated circuit device, comprising:

a logic circuit portion operating at a ground potential and a first power supply potential;

a voltage down converting circuit for generating, from an external power supply potential, a second internal power supply potential by down-converting the external power supply potential;

a boosting circuit for generating a boosted potential; and a memory portion operating with at least said ground potential, said second internal power supply potential and said boosted potential, for transmitting/receiving data to and from said logic circuit portion, said memory portion including a plurality of memory cells arranged in a matrix of rows and columns, each capable of storing either one of at least two levels corresponding to said ground potential and second internal power supply potential, and a driving circuit operating upon reception of said boosted potential, and generating, at least in a data reading operation from said memory cells, an internal control signal having a level corresponding to said boosted potential, for controlling said reading operation; wherein said driving circuit has an output node for outputting said internal control signal, and an LDD type P channel MOS transistor provided between said output node and said boosted potential, for pulling up a potential level of said output node.

14. The semiconductor integrated circuit device according to claim 13, wherein said memory portion further includes a plurality of word lines provided corresponding to rows of said memory cells, and a word driver circuit for selectively activating potential level of said word lines; wherein said driving circuit supplies said internal control signal as an active level of an output signal of said word line driver circuit.

15. The semiconductor integrated circuit device according to claim 13, wherein said plurality of memory cells are arranged divided into a plurality of memory cell blocks;

said memory portion further includes a sense amplifier portion commonly provided corresponding to a prescribed number of memory cell blocks in said plurality of memory cell blocks, for amplifying data read from said memory cells of a selected memory cell block, and a gate circuit for selectively coupling said sense amplifier portion and the corresponding memory cell block; and said gate circuit has a plurality of N channel MOS transistors controlled by said internal control signal, for opening/closing coupling between said memory cell blocks and said sense amplifier portion.

16. The semiconductor integrated circuit device according to claim 13, further comprising a data input/output unit operating upon reception of said external power supply potential and said ground potential, for transmitting/receiving data to and from said logic circuit portion and the outside of said semiconductor integrated circuit device; wherein said data input/output portion includes a buried channel type P channel MOS pull up transistor and an N channel MOS pull down transistor connected in series between said external power supply potential and said ground potential.

17. The semiconductor integrated circuit device according to claim 13, further comprising a data input/output portion operating upon reception of said external power supply potential and said ground potential, for transmitting/receiving data between said logic portion and the outside of said semiconductor integrated circuit device; wherein said data input/output portion includes an LDD type P channel MOS pull up transistor and an N channel MOS pull down transistor connected in series between said external power supply potential and said ground potential.

18. A semiconductor integrated circuit device, comprising:

a logic circuit portion operating at a ground potential and a first power supply potential;

a voltage down converting circuit for generating, from an external power supply potential, a second internal power supply potential by down-converting the external power supply potential;

a boosting circuit for generating a boosted potential; and a memory portion operating with at least said ground potential and said second internal power supply potential and said boosted potential, for transmitting/receiving data to and from said logic circuit portion, said memory portion including a plurality of memory cells arranged in a matrix of rows and columns, each capable of storing either one of at least two levels corresponding to said ground potential and said second internal power supply potential, respectively, said plurality of memory cells being arranged divided in a plurality of memory cell blocks along a column direction, a driving circuit operating upon reception of said boosted potential, for generating, at least in a data reading operation from said memory cells, an internal control signal having a level corresponding to said boosted potential, for controlling said reading operation, a sense amplifier band commonly provided corresponding to every pair of adjacent memory cell blocks of said plurality of memory cell blocks, arranged along a row direction, for amplifying data read from said memory cells in a selected memory cell block, a word line driving circuit band provided along a column direction for every prescribed number of memory cell columns, a signal line for transmitting said internal control signal, a plurality of P channel pull up transistors provides at every region where said word line driving circuit band and said sense amplifier band intersect, for driving said first signal line level to said boosted potential, in response to activation of said internal control signal, and a gate circuit for selectively coupling said sense amplifier band to a corresponding memory cell block, said gate circuit having a plurality of N channel MOS transistors controlled by a potential level of said signal line, for opening/closing coupling of said memory cell block and said sense amplifier portion.

19. The semiconductor integrated circuit device according to claim 18, wherein each of said plurality of pull up transistors is a buried channel type P channel MOS transistor.

20. The semiconductor integrated circuit device according to claim 18, wherein each of said plurality of pull up transistors is an LDD type P channel MOS transistor.

21. A semiconductor integrated circuit device, comprising:

a logic circuit portion operating at an operation power supply of a first power supply potential, and including a first surface channel type N channel transistor and a surface channel type P channel transistor; and a second surface channel type N channel transistor coupled to said logic circuit portion and receiving at a drain electrode, a potential higher than said first power potential.

22. The semiconductor integrated circuit device according to claim 21, further comprising:

a memory portion exchanging data with said logic portion; wherein said memory portion includes a plurality of memory cells storing said data, an internal voltage down converting circuit down-converting an external power supply potential, and a boosted potential generating circuit boosting the down-converted potential from said voltage down converting circuit to produce a boosted potential; and said second surface channel type N channel transistor receives said boosted potential at a drain electrode.

23. A semiconductor integrated circuit device, comprising:

a logic circuit portion operating at an operation power supply of a first power supply potential and including a surface channel type N channel transistor and a surface channel type P channel transistor; and a buried channel type P channel transistor coupled to said logic circuit portion and receiving at a source electrode a voltage higher than said first power supply potential.

24. The semiconductor integrated circuit device according to claim 23, further comprising:

an output terminal; and a data I/O circuit receiving data from said logic portion and outputting the data through said output terminal; wherein said data I/O circuit includes said buried channel type P channel transistor, and said buried channel type P channel transistor is connected between a potential node higher than said first power supply potential and said output terminal.

25. A semiconductor integrated circuit device, comprising:

a driving circuit receiving an input signal having first and second potential levels, and outputting the received signal as an output signal having said first potential level and a potential level higher than said second potential level;

a first node to which said first potential is applied; and a second node to which a third potential higher than said second potential is applied; wherein said driving circuit includes fourth and fifth nodes, a first surface channel type N channel transistor connected between said first node and said fourth node, and receiving said input signal at its gate, a first surface channel type P channel transistor connected between said second node and said fourth node, and having its gate electrode connected to said fifth node, a second surface channel type N channel transistor connected between said first node and said fifth node and receiving at its gate an inverted signal of said input signal, a second surface channel type P channel transistor connected between said second node and said fifth node, and having its gate electrode connected to said fourth node, an output node outputting said output signal, and a third surface channel type N channel transistor connected between said output node and said second node, and having its gate electrode connected to said fourth node.

26. A semiconductor integrated circuit device, comprising:

a driving circuit receiving an input signal having first and second potential levels, and outputting the received signal as an output signal having said first potential level and a potential level higher than said second potential level;

a first node to which said first potential is applied; and a second node to which a third potential higher than said second potential is applied; wherein said driving circuit includes fourth and fifth nodes, a first surface channel type N channel transistor connected between said first node and said fourth node, and receiving said input signal at its gate, a first surface channel type P channel transistor connected between said second node and said fourth node, and having its gate electrode connected to said fifth node, a second surface channel type N channel transistor connected between said first node and said fifth node and receiving at its gate an inverted signal of said input signal, a second surface channel type P channel transistor connected between said second node and said fifth node, and having its gate electrode connected to said fourth node, an output node outputting said output signal, and a first buried channel type P channel transistor connected between said output node and said second node having its gate electrode connected to said fifth node.

* * * * *